United States Patent
Yamaguchi et al.

(10) Patent No.: US 9,322,092 B2
(45) Date of Patent: Apr. 26, 2016

(54) SPUTTERING APPARATUS AND METHOD OF MANUFACTURING ELECTRONIC DEVICE

(75) Inventors: Nobuo Yamaguchi, Tama (JP); Kimiko Mashimo, Hachioji (JP); Shinya Nagasawa, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 13/606,346

(22) Filed: Sep. 7, 2012

(65) Prior Publication Data

US 2012/0325651 A1 Dec. 27, 2012

Related U.S. Application Data

(63) Continuation of application No. PCT/JP2010/007140, filed on Dec. 8, 2010.

(30) Foreign Application Priority Data

Mar. 26, 2010 (JP) .................................. 2010-072126

(51) Int. Cl.
*H01J 37/34* (2006.01)
*C23C 14/34* (2006.01)
(Continued)

(52) U.S. Cl.
CPC .............. *C23C 14/34* (2013.01); *C23C 14/564* (2013.01); *H01J 37/32477* (2013.01); *H01J 37/32504* (2013.01); *H01J 37/3411* (2013.01); *H01J 37/3417* (2013.01); *H01J 37/3447* (2013.01)

(58) Field of Classification Search
CPC . H01J 37/34; H01J 37/3447; H01J 37/32477; H01J 37/32504; H01J 37/3411; H01J 37/3417; C23C 14/34; C23C 14/564
USPC ........................... 204/192.12, 298.07, 298.11
See application file for complete search history.

(56) References Cited

U.S. PATENT DOCUMENTS

| | | | | |
|---|---|---|---|---|
| 3,681,227 A | * | 8/1972 | Szupillo | .................. C23C 14/04 |
| | | | | 204/192.16 |
| 5,595,814 A | | 1/1997 | Yamagata et al. | |
| 6,444,103 B1 | * | 9/2002 | Moslehi et al. | .......... 204/298.11 |

(Continued)

FOREIGN PATENT DOCUMENTS

| CN | 101469406 A | 7/2009 |
|---|---|---|
| CN | 1010469406 A | 7/2009 |

(Continued)

OTHER PUBLICATIONS

Machine translation to Takayama (JP 05-148632 published Jun. 1993) cited on IDS Sep. 10, 2012.*

(Continued)

*Primary Examiner* — John Brayton
(74) *Attorney, Agent, or Firm* — Fitzpatrick, Cella, Harper & Scinto

(57) ABSTRACT

It is an object of this invention to prevent a deposited film from adhering to an exhaust chamber so as to suppress the generation of particles. A sputtering apparatus (1) includes a shutter accommodation unit (23) which is detachably placed in an exhaust chamber (8) and accommodates a shutter (19) in a retracted state, and shield members (40a, 40b) which at least partially cover the exhaust port of the exhaust chamber (8), and are at least partially formed around an opening portion of the shutter accommodation unit (23).

8 Claims, 16 Drawing Sheets

(51) Int. Cl.
*C23C 14/56* (2006.01)
*H01J 37/32* (2006.01)

(56) References Cited

U.S. PATENT DOCUMENTS

| | | | |
|---|---|---|---|
| 6,592,726 | B1 | 7/2003 | Hashimoto et al. |
| 7,001,491 | B2 * | 2/2006 | Lombardi et al. ....... 204/192.12 |
| 8,147,664 | B2 | 4/2012 | Yamaguchi et al. |
| 2002/0175070 | A1 * | 11/2002 | Furuta ...................... 204/192.16 |
| 2003/0155234 | A1 * | 8/2003 | Feltsman et al. ......... 204/298.11 |
| 2004/0084305 | A1 * | 5/2004 | Fukuchi et al. .......... 204/298.02 |
| 2005/0199490 | A1 * | 9/2005 | Nomura et al. .......... 204/298.11 |
| 2006/0151314 | A1 | 7/2006 | Fukuchi et al. |
| 2009/0114529 | A1 | 5/2009 | Dekempeneer et al. |
| 2009/0166195 | A1 | 7/2009 | Kobayashi et al. |
| 2010/0224482 | A1 | 9/2010 | Yamaguchi et al. |
| 2010/0243438 | A1 | 9/2010 | Yamaguchi et al. |
| 2010/0252417 | A1 | 10/2010 | Allen et al. |

FOREIGN PATENT DOCUMENTS

| | | | |
|---|---|---|---|
| JP | 63-247361 A | | 10/1988 |
| JP | 63247361 A | * | 10/1988 |
| JP | 2-149669 A | | 6/1990 |
| JP | 4-193946 A | | 7/1992 |
| JP | 04193946 A | * | 7/1992 |
| JP | 5-148632 A | | 6/1993 |
| JP | 5-339725 A | | 12/1993 |
| JP | 7-331414 A | | 12/1995 |
| JP | 8-148436 A | | 6/1996 |
| JP | 2001-11620 A | | 1/2001 |
| JP | 2001-335927 A | | 12/2001 |
| JP | 2004-18885 A | | 1/2004 |
| JP | 2004-165655 A | | 6/2004 |
| JP | 2004-193360 A | | 7/2004 |
| JP | 2009-531544 A | | 9/2009 |
| JP | 2010-126798 A | | 6/2010 |
| WO | 2010/061603 A1 | | 3/2010 |
| WO | 2010061589 A1 | | 6/2010 |

OTHER PUBLICATIONS

International Search Report in International Application No. PCT/JP2010/007140, filed Dec. 8, 2012 (2 pages).
Office Action issued in Chinese Patent Application No. 201080065780.8, dated Dec. 23, 2013 (16 pages).
Office Action issued in Japanese Patent Application No. 2013-268066, dated Nov. 10, 2014 (2 pages).
Office Action issued in Chinese Patent Application No. 201410187146.1, dated Aug. 28, 2015 (7 pages).

* cited by examiner

F I G. 5
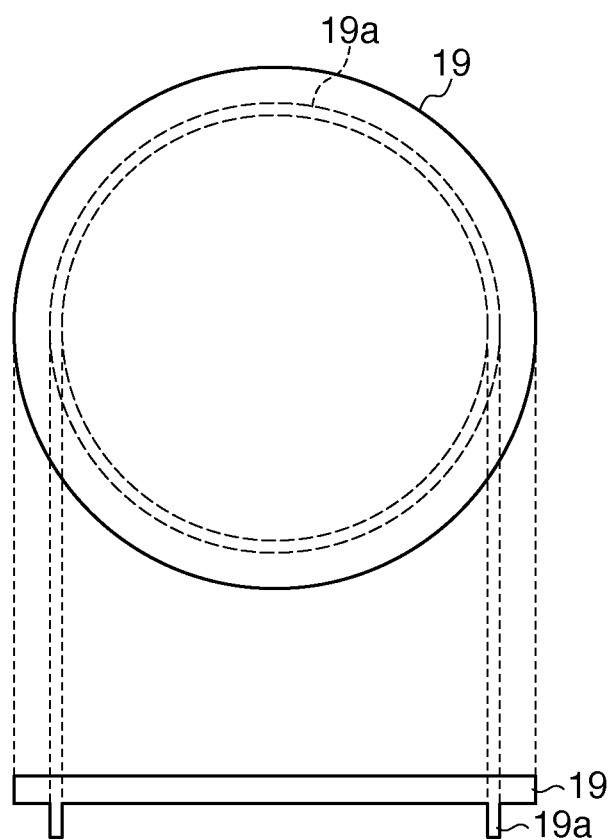
F I G. 6
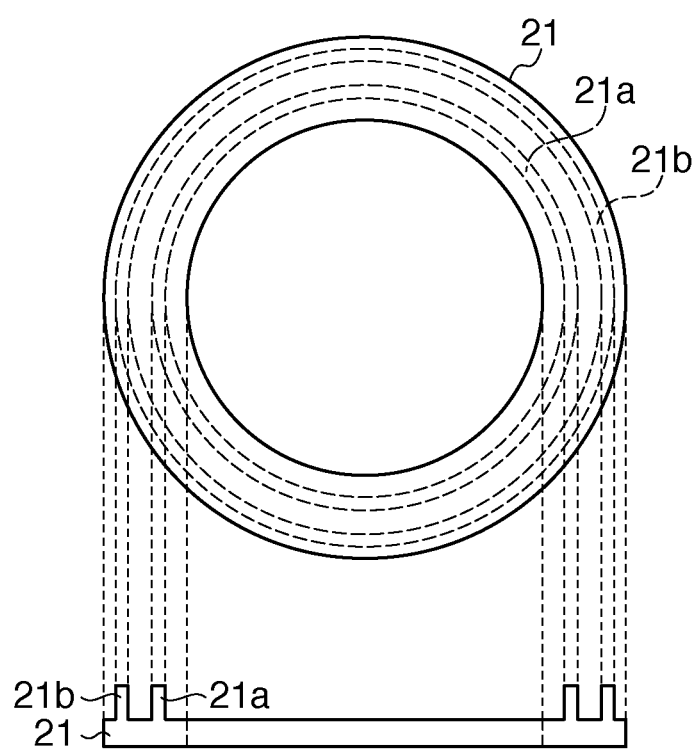

F I G. 9
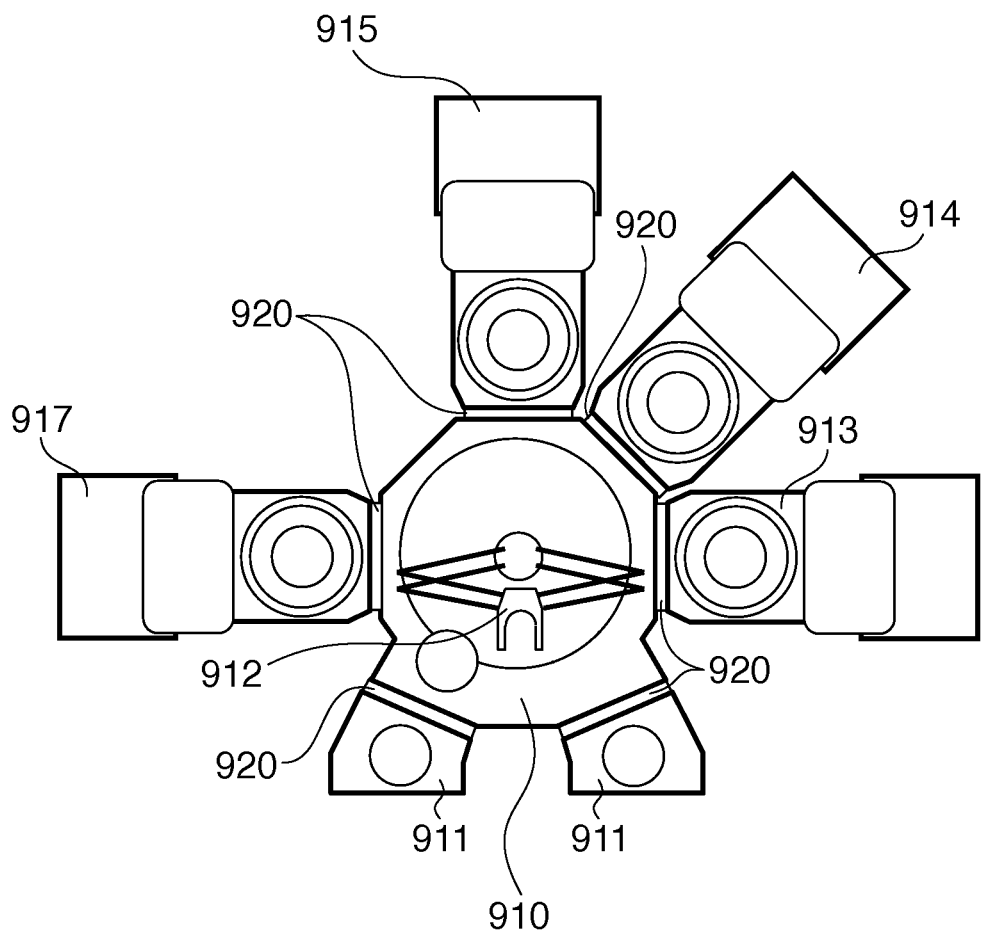

FIG. 11

| | GAS SPIKING | PLASMA IGNITION | PRE-SPUTTERING | CONDITIONING 1 | GAS SPIKING | PLASMA IGNITION | PRE-SPUTTERING | CONDITIONING 2 |
|---|---|---|---|---|---|---|---|---|
| STEP NUMBER (S) | 1101 | 1102 | 1103 | 1104 | 1105 | 1106 | 1107 | 1108 |
| SET TIME (SEC) | 0.1 | 2.0 | 5.0 | 240.0 | 5.0 | 2.0 | 5.0 | 180.0 |
| TARGET SHUTTER | CLOSED | CLOSED | CLOSED | OPEN | CLOSED | CLOSED | CLOSED | OPEN |
| SUBSTRATE SHUTTER | CLOSED | CLOSED | CLOSED | CLOSED | CLOSED | CLOSED | CLOSED | CLOSED |
| POWER SUPPLIED TO TARGET (W) | 0 | 1000 | 1000 | 1000 | 0 | 750 | 750 | 750 |
| ARGON FLOW RATE (SCCM) | 400 | 400 | 100 | 100 | 200 | 200 | 10 | 10 |
| NITROGEN FLOW RATE (SCCM) | 0 | 0 | 0 | 0 | 10 | 10 | 10 | 10 |

FIG. 12

| | TIMING | DETERMINATION CONDITION |
|---|---|---|
| CONDITIONING START CONDITION 1 | CONDITIONING IS PERFORMED AFTER LOT PROCESSING | TOTAL NUMBER OF PROCESSED SUBSTRATES HAS REACHED SET VALUE — 1201 |
| CONDITIONING START CONDITION 2 | CONDITIONING IS PERFORMED UPON INTERRUPTION OF LOT PROCESSING | |
| CONDITIONING START CONDITION 3 | CONDITIONING IS PERFORMED AFTER LOT PROCESSING | TOTAL NUMBER OF PROCESSED LOTS HAS REACHED SET VALUE — 1202 |
| CONDITIONING START CONDITION 4 | CONDITIONING IS PERFORMED UPON INTERRUPTION OF LOT PROCESSING | |
| CONDITIONING START CONDITION 5 | CONDITIONING IS PERFORMED AFTER LOT PROCESSING | TOTAL THICKNESS OF FILM DEPOSITED BY DEPOSITION APPARATUS HAS REACHED SET VALUE — 1203 |
| CONDITIONING START CONDITION 6 | CONDITIONING IS PERFORMED UPON INTERRUPTION OF LOT PROCESSING | |
| CONDITIONING START CONDITION 7 | CONDITIONING IS PERFORMED AFTER LOT PROCESSING | INTEGRATED POWER SUPPLIED TO TARGET HAS REACHED SET VALUE — 1204 |
| CONDITIONING START CONDITION 8 | CONDITIONING IS PERFORMED UPON INTERRUPTION OF LOT PROCESSING | |
| CONDITIONING START CONDITION 9 | CONDITIONING IS PERFORMED AFTER LOT PROCESSING | INTEGRATED POWER PER SHIELD HAS REACHED SET VALUE — 1205 |
| CONDITIONING START CONDITION 10 | CONDITIONING IS PERFORMED UPON INTERRUPTION OF LOT PROCESSING | |
| CONDITIONING START CONDITION 11 | CONDITIONING IS PERFORMED AFTER LOT PROCESSING | STANDBY TIME HAS REACHED SET VALUE — 1206 |
| CONDITIONING START CONDITION 12 | CONDITIONING IS PERFORMED UPON INTERRUPTION OF LOT PROCESSING | |
| CONDITIONING START CONDITION 13 | CONDITIONING IS PERFORMED BEFORE LOT PROCESSING | DEPOSITION CONDITION IS CHANGED — 1207 |

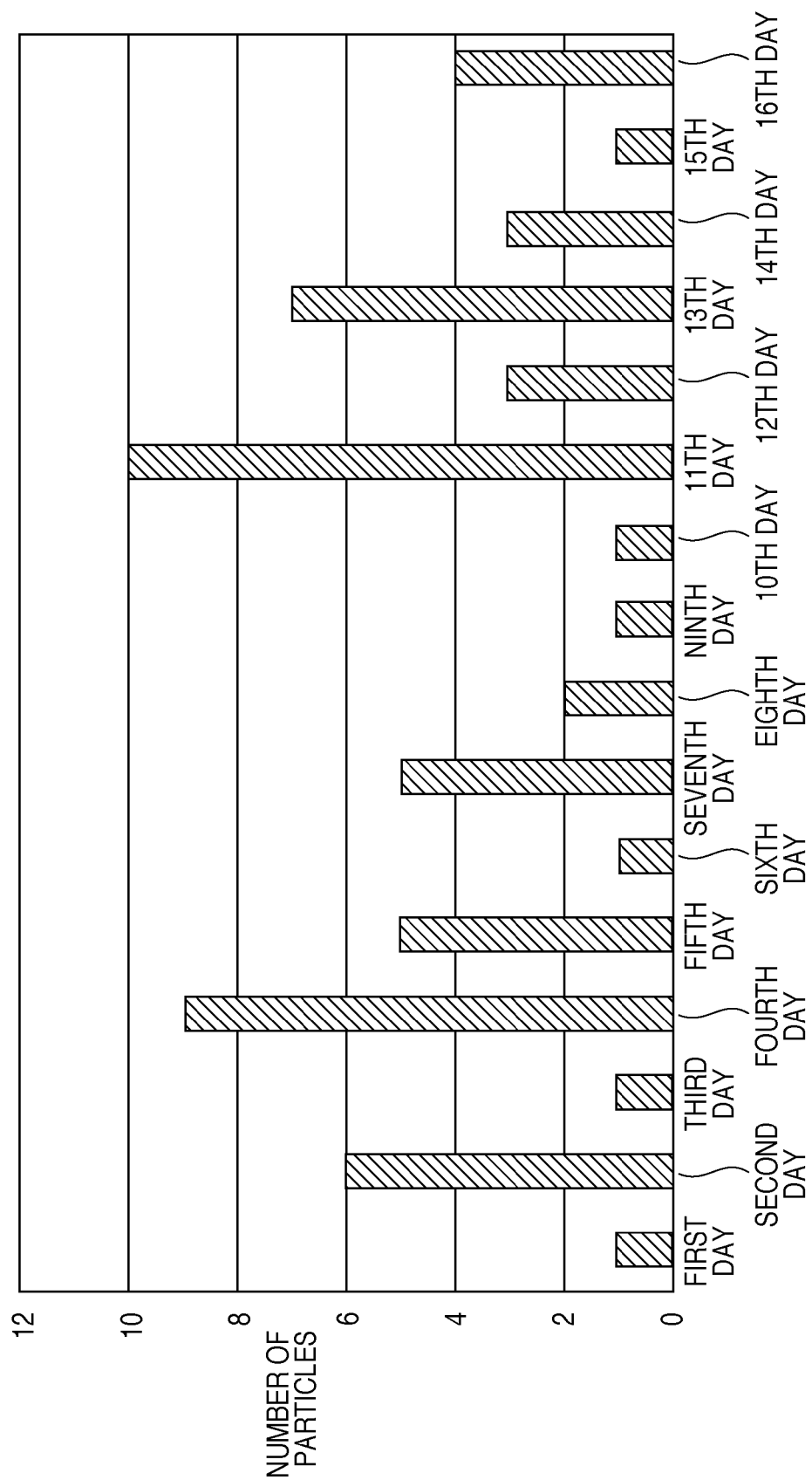

SPUTTERING APPARATUS AND METHOD OF MANUFACTURING ELECTRONIC DEVICE

CROSS-REFERENCE TO RELATED APPLICATIONS

This application is a continuation of International Application No. PCT/JP2010/007140, filed Dec. 8, 2012, which claims the benefit of Japanese Patent Application No. 2010-072126, filed Mar. 26, 2010. The contents of the aforementioned applications are incorporated herein by reference in their entirety.

TECHNICAL FIELD

The present invention relates to a sputtering apparatus used to deposit a material in a process of manufacturing an electronic device such as a magnetic storage medium, a semiconductor device, or a display device, and a method of manufacturing an electronic device using the sputtering apparatus.

BACKGROUND ART

With the miniaturization of semiconductor elements, a demand for the deposition characteristics is becoming stricter. A gate insulating film, for example, is required to have a very small thickness. Also, a thin electrode film formed on a very thin insulating film, for example, is required to be stably deposited. Moreover, due to a concern in adverse effects on element performance exerted by impurities such as carbon in each film or at the interface between thin films, a lower impurity level is required.

The sputtering method used as one of deposition methods can deposit a high quality film because it employs a material which contains no impurities such as carbon, unlike the CVD method. The sputtering method is also advantageous in terms of avoiding problems or challenges such as a process of eliminating toxic substances generated by by-products and unused materials as this method employs no toxic organic metal material, unlike the CVD method.

In a sputtering method of depositing a thin film on a substrate such as silicon (to be simply referred to as a "substrate" hereinafter), a target holder in a vacuum chamber evacuated to a vacuum holds a vapor deposition source called a target made of a material to be deposited on a substrate. A substrate holder in the vacuum chamber supports the substrate. A gas such as Ar is introduced into the vacuum chamber, and a high voltage is applied to the target, thereby generating a plasma. In the sputtering method, a target material is deposited on the substrate, supported by the substrate holder, using the phenomenon in which the target is sputtered by charged particles in the discharge plasma. In general, positive ions in the plasma impinge on the target having a negative potential, so atoms and molecules are sputtered from the target material. These atoms and molecules will generically be referred to as sputtered particles hereinafter. These sputtered particles adhere to the substrate to form a film containing the target material on the substrate.

In a sputtering apparatus, a shield plate that can be opened and closed, called a shutter, is normally placed between a target and a substrate. This shutter is used to control the timing of the start of deposition so as not to start a deposition process until the plasma state in the vacuum chamber becomes stable. That is, the shutter is kept closed so as not to deposit a film on the substrate in the period from when a plasma is generated upon application of a high voltage to the target until the plasma becomes stable. After the plasma becomes stable, the shutter opens to start deposition. When the start of deposition is controlled using the shutter in this way, a film can be deposited on the substrate with high controllability using a stable plasma, thus depositing a film with high quality.

A plasma processing apparatus disclosed in PTL1 includes a wafer holder, moving shutter, and shutter accommodation unit disposed in a vacuum chamber. The wafer holder includes a plate on which a wafer is placed, and a plurality of wafer lift pins. The moving shutter moves parallel to the wafer. The shutter accommodation unit accommodates the moving shutter while the wafer is processed by a plasma.

CITATION LIST

Patent Literature

PTL1: Japanese Patent Laid-Open No. 2004-193360

SUMMARY OF INVENTION

Technical Problem

However, in the conventional plasma processing apparatus described in PTL1, a film adheres to the inner wall of the vacuum chamber or the inner wall of the shutter accommodation unit, and generates particles.

Solution to Problem

The present invention has been made in consideration of the above-mentioned problem, and has as its object to provide a deposition technique which suppresses the generation of particles in the chamber.

In order to achieve the above-mentioned object, according to an aspect of the present invention, there is provided a sputtering apparatus comprising a processing chamber configured to perform deposition processing, an exhaust chamber connected to the processing chamber via an exhaust port, an exhaust device which is connected to the exhaust chamber, and evacuates the processing chamber through the exhaust chamber, a substrate holder which is placed in the processing chamber, and configured to place a substrate thereon, a target holder placed in the processing chamber, a shutter capable of moving to assume one of a shielding state in which the shutter shields a gap between the substrate holder and the target holder, and a retracted state in which the shutter is retracted from the gap between the substrate holder and the target holder, driving means for driving the shutter to set the shutter in one of the shielding state and the retracted state, a shutter accommodation unit which is detachably placed in the exhaust chamber and accommodates the shutter in the retracted state, and a shield member which at least partially covers the exhaust port of the exhaust chamber, and is at least partially formed around an opening portion of the shutter accommodation unit.

According to another aspect of the present invention, there is provided a method of manufacturing an electronic device using a sputtering apparatus comprising a processing chamber configured to perform deposition processing, an exhaust chamber connected to the processing chamber via an exhaust port, an exhaust device which is connected to the exhaust chamber, and evacuates the processing chamber through the exhaust chamber, a substrate holder which is placed in the processing chamber, and configured to place a substrate thereon, a target holder placed in the processing chamber, a shutter capable of moving to assume one of a shielding state in which the shutter shields a gap between the substrate holder and the target holder, and a retracted state in which the shutter is retracted from the gap between the substrate holder and the target holder, driving means for driving the shutter to set the shutter in one of the shielding state and the retracted state, a shutter accommodation unit which is detachably placed in the exhaust chamber and accommodates the shutter in the retracted state, and a shield member which at least partially covers the exhaust port of the exhaust chamber, and is at least partially formed around an opening portion of the shutter accommodation unit, comprising a first step of setting the shutter in the shielding state by the driving means, a second step of depositing a film by sputtering a target held on the target holder while the shutter is kept in the shielding state, and a third step of setting the shutter in the retracted state by the driving means, and sputtering the target to deposit a film on the substrate placed on the substrate holder.

Advantageous Effects of Invention

According to the present invention, a shutter accommodation unit and shields are provided separately from an exhaust chamber to prevent a film from adhering to the exhaust chamber, thereby making it possible to suppress the generation of particles in the chamber. Also, the shutter accommodation unit is placed in the exhaust chamber, thereby making it possible to suppress a rapid change in exhaust conductance upon a shutter opening/closing operation.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 5 is a view schematically showing a substrate shutter 19;

FIG. 6 is a view schematically showing a cover ring 21;

FIG. 9 is a view showing the schematic configuration of a flash memory stacked film deposition apparatus as an example of a vacuum thin deposition apparatus including the sputtering apparatus according to the embodiment of the present invention;

FIG. 11 is a table showing the procedures for conditioning using the sputtering apparatus according to the embodiment of the present invention;

FIG. 12 is a table for explaining exemplary conditioning start conditions;

FIG. 13 is a graph showing the result of measuring once a day the number of particles which adhere onto a substrate when the processing shown in FIG. 10 is executed using the sputtering apparatus according to the embodiment of the present invention;

DESCRIPTION OF EMBODIMENTS

Exemplary preferred embodiments of the present invention will be described in detail below with reference to the accompanying drawings. However, constituent components described in these embodiments merely provide examples, so the technical scope of the present invention is determined by the scope of claims and is not limited by the following individual embodiments.

Figure 1:
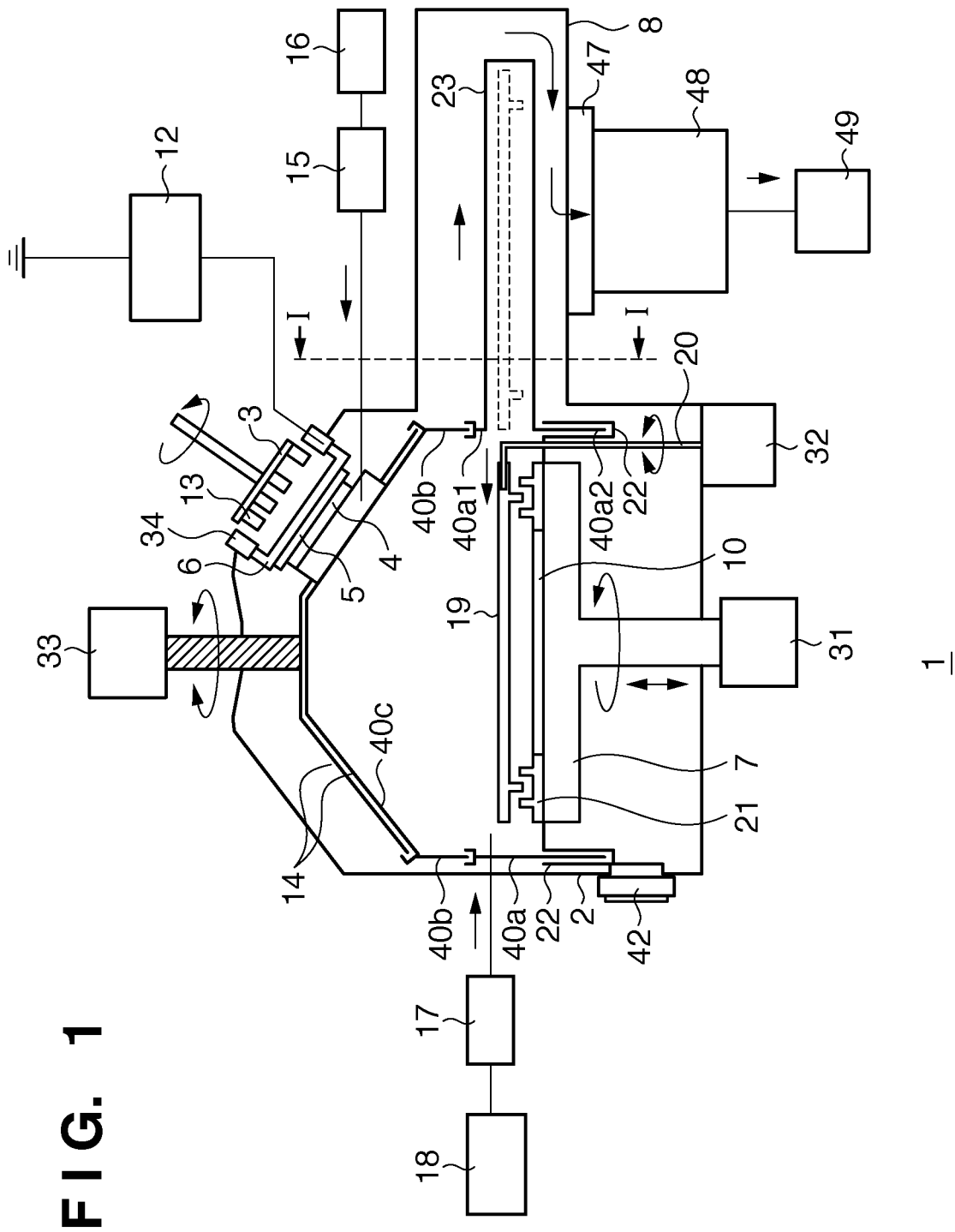
FIG. 1 is a schematic view of a sputtering apparatus according to an embodiment of the present invention.

The entire configuration of a sputtering apparatus 1 will be described with reference to FIG. 1. FIG. 1 is a schematic view of the sputtering apparatus 1 according to an embodiment of the present invention. Although a sputtering apparatus will be taken as an example of a deposition apparatus in this embodiment, the scope of the present invention is not limited to this example, and is also applicable to, for example, CVD and PVD apparatuses.

The sputtering apparatus 1 includes a vacuum chamber 2 which can be evacuated to a vacuum, an exhaust chamber 8 disposed adjacent to the vacuum chamber 2 through the vacuum chamber 2 and an exhaust port 301 (see FIG. 3), and an exhaust device which evacuates the vacuum chamber 2 through the exhaust chamber 8. Note that the exhaust device includes a turbo-molecular pump 48. Also, a dry pump 49 is connected to the turbo-molecular pump 48 of the exhaust device. Note that the exhaust device is disposed below the exhaust chamber 8 in order to minimize the footprint of the entire apparatus (the area occupied by the entire apparatus).

A target holder 6 which holds a target 4 through a back plate 5 is disposed in the vacuum chamber 2. The target holder 6 is placed at a position offset with respect to the substrate mounting position of a substrate holder 7. A target shutter 14 is disposed near the target holder 6 so as to cover it. The target shutter 14 has the structure of a rotary shutter. The target shutter 14 functions as a shield member for setting a closed state (shielding state) in which the gap between the substrate holder 7 and the target holder 6 is shielded, or an open state (retracted state) in which the gap between the substrate holder 7 and the target holder 6 is open. The target shutter 14 is provided with a target shutter driving mechanism 33 for opening/closing it.

The vacuum chamber 2 also includes the substrate holder 7 on which a substrate is placed, a substrate shutter 19 disposed between the substrate holder 7 and the target holder 6, and a substrate shutter driving mechanism 32 which opens/closes the substrate shutter 19. Note that the substrate shutter 19 is placed near the substrate holder 7, and functions as a shield member for setting a closed state in which the gap between the substrate holder 7 and the target holder 6 is shielded, or an open state in which the gap between the substrate holder 7 and the target holder 6 is open.

The vacuum chamber 2 moreover includes an inert gas introduction system 15 for introducing an inert gas (for example, argon) into the vacuum chamber 2, a reactive gas introduction system 17 for introducing a reactive gas (for example, oxygen or nitrogen) into the vacuum chamber 2, and a manometer (not shown) for measuring the pressure in the vacuum chamber 2.

An inert gas supply device (gas cylinder) 16 for supplying an inert gas is connected to the inert gas introduction system 15. The inert gas introduction system 15 includes, for example, a pipe for introducing an inert gas, a mass flow controller for controlling the flow rate of the inert gas, various valves for shutting off or starting the gas flow, and a pressure reducing valve and filter as needed. With this configuration, the inert gas introduction system 15 can stably supply an inert gas at a flow rate designated by a control device (not shown). An inert gas is supplied from the inert gas supply device 16, undergoes flow control by the inert gas introduction system 15, and is then introduced to the vicinity of the target 4.

A reactive gas supply device (gas cylinder) 18 for supplying a reactive gas is connected to the reactive gas introduction system 17. The reactive gas introduction system 17 includes, for example, a pipe for introducing a reactive gas, a mass flow controller for controlling the flow rate of the reactive gas, various valves for shutting off or starting the gas flow, and a pressure reducing valve and filter as needed. With this configuration, the reactive gas introduction system 17 can stably supply a reactive gas at a flow rate designated by a control device (not shown). A reactive gas is supplied from the reactive gas supply device 18, undergoes flow control by the reactive gas introduction system 17, and is then introduced to the vicinity of the substrate holder 7 which holds a substrate 10 (to be described later).

After the inert and reactive gases are introduced into the vacuum chamber 2, they are used to form a film and then exhausted by the turbo-molecular pump 48 and dry pump 49 upon passing through the exhaust chamber 8.

The inner surface of the vacuum chamber 2 is electrically grounded. The inner surface of the vacuum chamber 2 between the target holder 6 and the substrate holder 7 is provided with electrically grounded, cylindrical shield members (shields 40a and 40b), and a counter shield 40c placed on the ceiling so as to cover the inner surface of the vacuum chamber 2, which faces the substrate holder 7 and is other than the target holder portion (the shields 40a, 40b, and 40c will also simply be referred to as "shields" hereinafter). The shield means herein a member which is formed separately from the vacuum chamber 2 so as to prevent sputtered particles from directly adhering to the inner surface of the vacuum chamber 2 and thereby protect the inner surface of the vacuum chamber 2, and can be replaced periodically. In this case, the shield is made of stainless steel or an aluminum alloy. However, if the shield needs to have a given heat resistance, it may be made of titanium or a titanium alloy. If the shield need not have a given heat resistance, aluminum may be selected as its material in terms of economy and workability because it is less expensive than titanium and has a specific gravity lower than stainless steel. Also, because the shield is electrically grounded (connected to the ground), it can stabilize a plasma generated in a deposition space. Minute projections and recesses are formed on at least one face, facing the deposition space, of the surface of the shield by blasting such as sand blasting. This makes it hard for a film adhering on the shield to peel, thereby reducing the number of particles that may be generated due to peeling. Note that not only blasting but also, for example, metal spray processing may be used to form a metal thin film on the surface of the shield. In this case, metal spray processing costs more than blasting alone, but offers an advantage that a film adhering on the shield need only be peeled, together with a sprayed film, during maintenance in which the shield is removed to peel the adhering film. Also, metal spray processing prevents peeling of a sputtered film by reducing stress acting on the sputtered film using a sprayed thin film.

The exhaust chamber 8 connects the vacuum chamber 2 and the turbo-molecular pump 48 to each other. A main valve 47 for shutting off the gas flow between the sputtering apparatus 1 and the turbo-molecular pump 48 in maintenance is disposed between the exhaust chamber 8 and the turbo-molecular pump 48.

Figure 2:
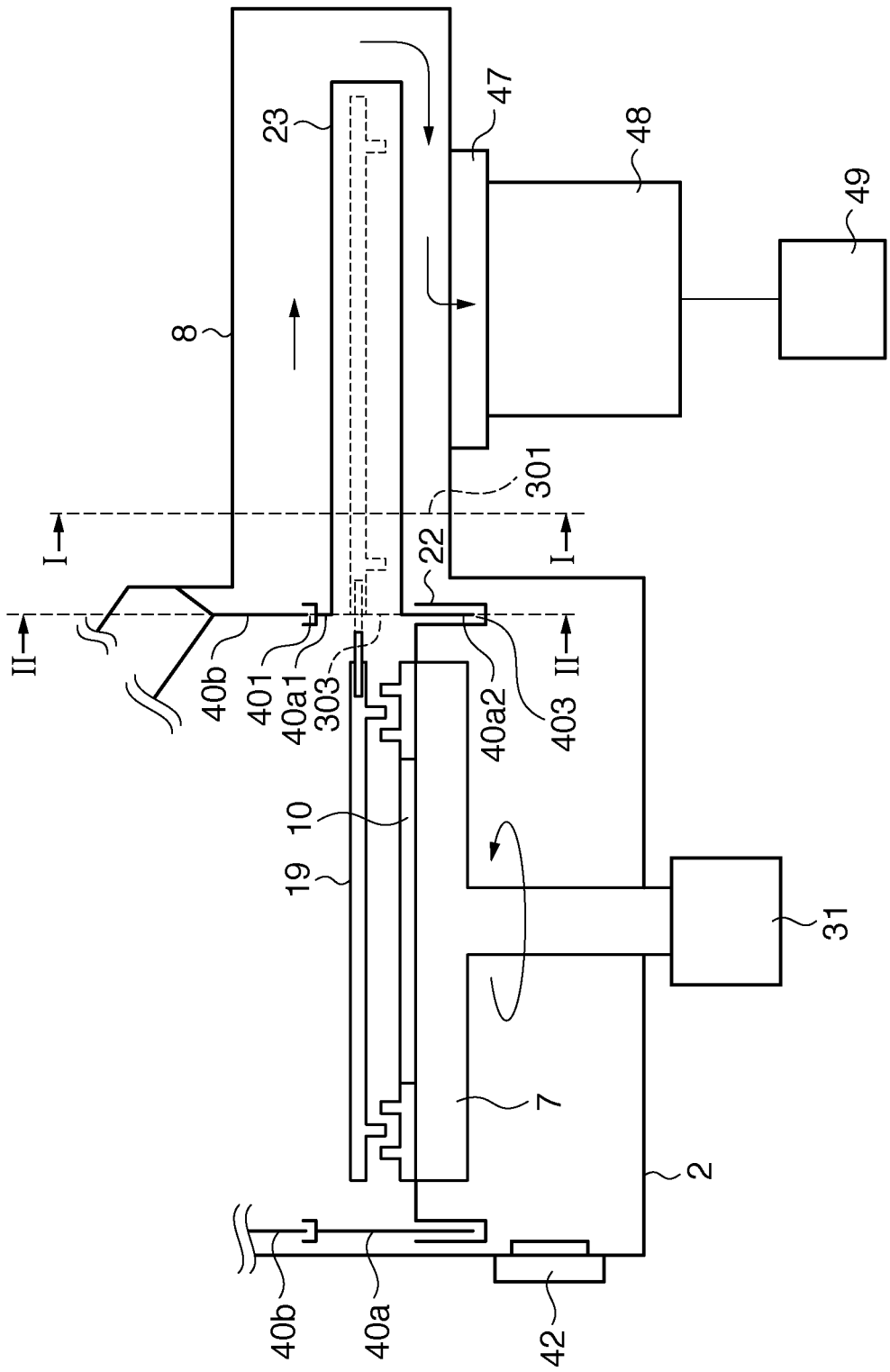
FIG. 2 is an enlarged view for explaining details of an exhaust chamber in FIG. 1.
Figure 3:
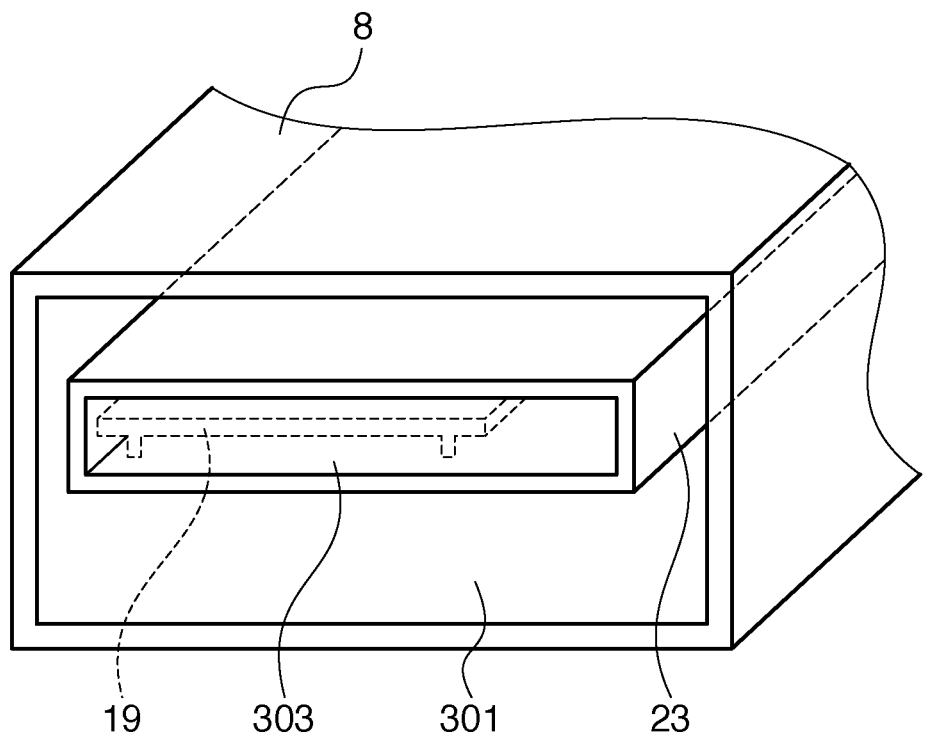
FIG. 3 is a sectional view taken along a line I-I in FIG. 2.
Figure 4:
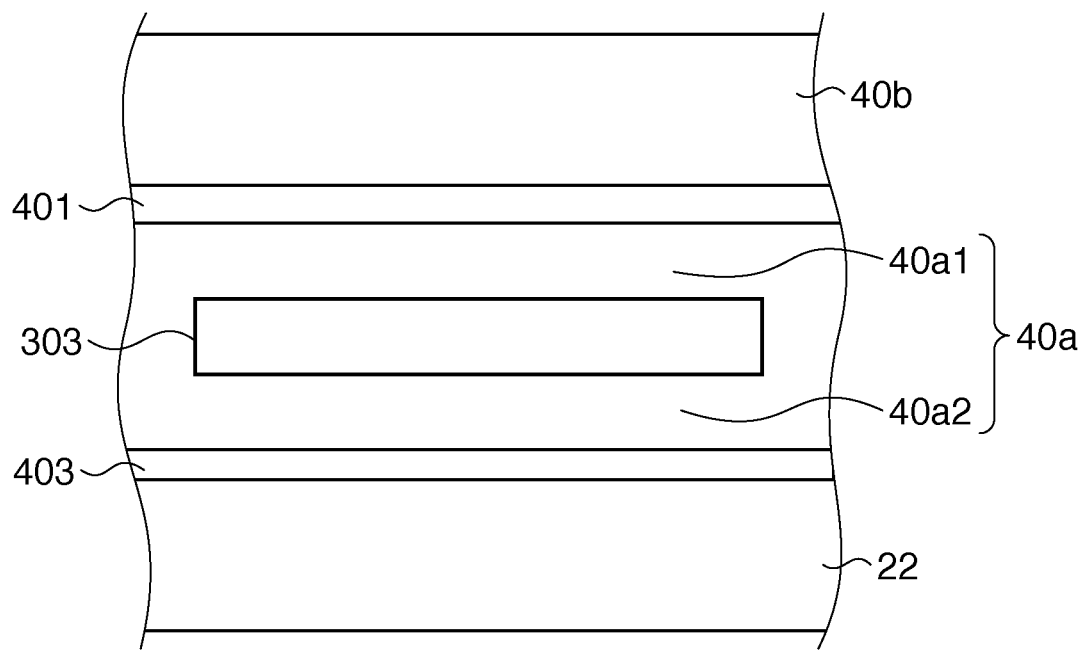
FIG. 4 is a sectional view taken along a line II-II in FIG. 2.

The configuration of a detachable shutter accommodation unit as a feature of the present invention will be described in detail next with reference to FIGS. 2, 3, and 4. FIG. 2 is an enlarged view for explaining details of the exhaust chamber 8. FIG. 3 is a sectional view taken along a line I-I in FIG. 2. FIG. 4 is a sectional view taken along a line II-II in FIG. 2. A detachable shutter accommodation unit 23 which accommodates the substrate shutter 19 when the substrate shutter 19 retracts from the vacuum chamber 2 is disposed in the exhaust chamber 8, as shown in FIG. 2. The shutter accommodation unit 23 has an opening portion 303 through which the substrate shutter 19 is to be extended/retracted, and portions other than the opening portion 303 are tightly sealed. Note that the shutter accommodation unit 23 is electrically grounded.

The shutter accommodation unit 23 is placed in the exhaust chamber 8 so that an exhaust region is formed around the shutter accommodation unit 23 to communicate with the turbo-molecular pump 48 via the main valve 47, as shown in FIG. 3.

FIG. 4 is a sectional view illustrating the portion surrounding the opening portion 303 of the shutter accommodation unit 23. The shield 40a including shields 40a1 and 40a2, the shield 40b, and a shield 22 are formed in a cylindrical shape in the vacuum chamber 2. An exhaust path 401 (first exhaust path) formed between the shields 40a1 and 40b is formed at a position above the opening portion 303 (a position on the side of the target holder 6 which constitutes a deposition means) as a circumferential gap around the cylindrical member. An exhaust path 403 (second exhaust path) formed between shields 40a2 and 22 is formed at a position below the opening portion 303 as a circumferential gap around the cylindrical member.

The shield 40a has an opening portion (hole portion) at a position corresponding to the opening portion 303 of the shutter accommodation unit 23, and functions as a first shield which covers the exhaust port. The shield 40b is disposed above the opening portion 303 of the shutter accommodation unit 23, and functions as a second shield which covers the exhaust port. The shield 22 is disposed below the opening portion 303 of the shutter accommodation unit 23, and functions as a third shield which covers the exhaust port. The exhaust conductance of the exhaust path 403 can be changed as a substrate holder driving mechanism 31 moves the substrate holder 7.

The shield 40a1 is fixed around the opening portion 303 of the shutter accommodation unit 23 so as to cover the exhaust port 301 of the exhaust chamber 8, as shown in FIGS. 2 and 4. The shields 40a1 and 40b form the exhaust path 401.

The distal end of the shield 40a1 has a recessed portion divided in a U shape, and the I-shaped shield 40b (projecting portion) is fitted in the U-shaped portion (recessed portion) in a noncontact state to form the exhaust path 401 as a so-called labyrinth-shaped exhaust path.

The labyrinth-shaped exhaust path 401 also functions as a noncontact seal. While the I-shaped shield 40b (projecting portion) is fitted in the U-shaped portion (recessed portion) formed at the distal end of the shield 40a1, a noncontact state, that is, a predetermined gap is formed between the recessed portion and the projecting portion. Upon the fitting of the projecting portion in the recessed portion, the exhaust port 301 of the shutter accommodation unit 23 is shielded. This makes it possible to prevent particles sputtered from the target 4 from passing through the exhaust path 401 and entering the exhaust chamber 8 and, eventually, to prevent particles from adhering to the inner wall of the exhaust chamber 8.

Similarly, the shield 40a2 is fixed around the opening portion 303 of the shutter accommodation unit 23 so as to cover the exhaust port 301 of the exhaust chamber 8. The shield 40a2 and the shield 22 connected to the substrate holder 7 form the exhaust path 403. The distal end of the shield 22 has a recessed portion divided in a U shape, and the I-shaped shield 40a2 (projecting portion) is fitted in the U-shaped portion (recessed portion) in a noncontact state to form the exhaust path 403 as a labyrinth-shaped exhaust path. Upon the fitting of the projecting portion of the shield 40a2 in the recessed portion of the shield 22, the exhaust port 301 of the shutter accommodation unit 23 is shielded. This makes it possible to prevent particles sputtered from the target 4 from passing through the exhaust path 403 and entering the exhaust chamber 8 and, eventually, to prevent particles from adhering to the inner wall of the exhaust chamber 8. It is important to provide the shutter accommodation unit 23 and the exhaust chamber 8 as separate members. This is because it is difficult to attain both the pressure resistance and exhaust performance required for the exhaust chamber 8, and the dustproof performance required for the shutter accommodation unit 23. Both these performances can easily be attained by disposing the separate, shutter accommodation unit 23 in the exhaust chamber 8.

The exhaust conductance is sufficiently higher in the exhaust path 401 than in the exhaust path 403 when the substrate holder has ascended to its upper position, as shown in FIG. 1. That is, a gas flowing into the exhaust chamber 8 flows more easily through the exhaust path 401 than through the exhaust path 403. When two exhaust conductances are connected in parallel with each other, the combined conductance is the sum of these exhaust conductances. Therefore, as long as one exhaust conductance is sufficiently higher than the other exhaust conductance, the lower conductance can be ignored. When the structure of the exhaust path 401 or 403 is used, the exhaust conductance can be adjusted in accordance with the width of the gap of the exhaust path and the distance (length) across which the labyrinth-shaped portions of the exhaust path overlap each other.

The widths of the gaps of the exhaust paths 401 and 403 are nearly the same, and the distance (length) across which the labyrinth-shaped portions of the exhaust path 401 overlap each other is shorter than that across which the labyrinth-shaped portions of the exhaust path 403 overlap each other, so the exhaust conductance is higher in the exhaust path 401 than in the exhaust path 403, as shown in, for example, FIG. 2. Hence, a gas introduced from the inert gas introduction system 15 or reactive gas introduction system 17 into a process space (a space which is surrounded by the shields and target and filled with a plasma) is exhausted mainly through the exhaust path 401. This means that the exhaust conductance from the process space in the vacuum chamber 2 to the exhaust chamber 8 is not influenced by an operation of opening/closing the substrate shutter 19. Because the main exhaust path from the process space in the vacuum chamber 2 to the exhaust chamber 8 is formed at a position at which it is not influenced by opening/closing of the substrate shutter 19, the exhaust conductance from the process space in the vacuum chamber 2 to the exhaust chamber 8 remains the same upon opening/closing of the substrate shutter 19. This makes it possible to stabilize the pressure of the gas in the process space within the vacuum chamber 2, which influences plasma generation upon opening/closing of the substrate shutter 19. Therefore, even when the substrate shutter 19 opens/closes, it is possible to suppress a change in exhaust conductance from the process space in the vacuum chamber 2 to the exhaust chamber 8 to stabilize the pressure in the vacuum chamber 2, thus depositing a film with high quality.

Referring back to FIG. 1, the entire configuration of the sputtering apparatus 1 will be described. Magnets 13 for performing magnetron sputtering are arranged on the back of the target 4 when viewed from the sputter surface. The magnets 13 are held on a magnet holder 3 and can be rotated by a magnet holder rotation mechanism (not shown). To uniform erosion of the target 4, the magnets 13 are rotated during discharge.

The target 4 is placed at a position (offset position) obliquely above the substrate 10. That is, the central point of the sputter surface of the target 4 lies at a position shifted by a predetermined distance with respect to a normal to the substrate 10 at its central point. The target holder 6 is connected to a power supply 12 which supplies sputter discharge power. When the power supply 12 applies a voltage to the target holder 6, discharge starts so that sputtered particles are deposited on the substrate 10.

Although the sputtering apparatus 1 shown in FIG. 1 includes a DC power supply in this embodiment, the present invention is not limited to this, and the sputtering apparatus 1 may include, for example, an RF power supply. When an RF power supply is employed, it is necessary to place a matching device between the power supply 12 and the target holder 6.

The target holder 6 is insulated from the vacuum chamber 2 at the ground potential by an insulator 34 and is made of a metal such as Cu, so it serves as an electrode upon being supplied with DC or RF power. Note that the target holder 6 includes a water channel (not shown) formed in it, and can be cooled by cooling water supplied from a water pipe (not shown). The target 4 contains a material component to be deposited on the substrate 10. Since the target 4 influences the film purity, it desirably uses a high purity material.

The back plate 5 interposed between the target 4 and the target holder 6 is made of a metal such as Cu and holds the target 4.

The target shutter 14 is disposed near the target holder 6 so as to cover it. The target shutter 14 functions as a shield member for setting a closed state in which the gap between the substrate holder 7 and the target holder 6 is shielded, or an open state in which the gap between the substrate holder 7 and the target holder 6 is open.

Also, the target shutter 14 is provided with the target shutter driving mechanism 33 for driving it. The counter shield 40c is placed on the substrate side with respect to the target shutter 14. The counter shield 40c has an opening hole in its portion facing the target holder 6.

A ring-shaped shield member (to be referred to as a "cover ring 21" hereinafter) is disposed on the outer edge (outer peripheral portion) of the mounting portion of the substrate 10 on the surface of the substrate holder 7. The cover ring 21 prevents sputtered particles from adhering to portions other than the deposition surface of the substrate 10 placed on the substrate holder 7. Note that the portions other than the deposition surface include not only the upper surface of the substrate holder 7 covered with the cover ring 21 but also the side and lower surfaces of the substrate 10. The substrate holder 7 is provided with the substrate holder driving mechanism 31 for lifting/lowering it or rotating it at a predetermined speed. The substrate holder driving mechanism 31 can lift/lower the substrate holder 7 so that it ascends toward the substrate shutter 19 in a closed state, or descends in a direction away from the substrate shutter 19.

The substrate shutter 19 is placed near the substrate 10 between the substrate holder 7 and the target holder 6. The substrate shutter 19 is supported so that the surface of the substrate 10 is covered with a substrate shutter support member 20. The substrate shutter driving mechanism 32 rotates and translates the substrate shutter support member 20 to insert the substrate shutter 19 into the gap between the target 4 and the substrate 10 at a position near the surface of the substrate 10 (closed state). Upon the insertion of the substrate shutter 19 into the gap between the target 4 and the substrate 10, the gap between the target 4 and the substrate 10 is shielded. However, as the substrate shutter driving mechanism 32 operates so that the substrate shutter 19 retracts from the gap between the target holder 6 (target 4) and the substrate holder 7 (substrate 10), the gap between the target holder 6 (target 4) and the substrate holder 7 (substrate 10) opens (open state). The substrate shutter driving mechanism 32 opens/closes the substrate shutter 19 to set a closed state in which the gap between the substrate holder 7 and the target holder 6 is shielded, or an open state in which the gap between the substrate holder 7 and the target holder 6 is open. The substrate shutter 19 is accommodated in the shutter accommodation unit 23 in an open state. To reduce the apparatus area, the shutter accommodation unit 23 into which the substrate shutter 19 is retracted is preferably small enough to be inserted into a conduit in the exhaust path up to the turbo-molecular pump 48 for high vacuum exhaust, as shown in FIG. 1.

The substrate shutter 19 is made of stainless steel or an aluminum alloy. Alternatively, the substrate shutter 19 is sometimes made of titanium or a titanium alloy when a given heat resistance is required. Minute projections and recesses are formed on at least one face, facing the target 4, of the surface of the shield by blasting such as sand blasting. This makes it hard for a film adhering on the shield to peel, thereby reducing the number of particles that may be generated due to peeling. Note that not only blasting but also, for example, metal spray processing may be used to form a metal thin film on the surface of the substrate shutter 19. In this case, metal spray processing costs more than blasting alone, but offers an advantage that a film adhering on the shield need only be peeled, together with a sprayed film, during maintenance in which the substrate shutter 19 is removed to peel the adhering film. Also, metal spray processing prevents peeling of a sputtered film by reducing stress acting on the sputtered film using a sprayed thin film.

The shapes of the cover ring 21 and substrate shutter 19 will be described in detail herein with reference to FIGS. 5 and 6. FIG. 5 is a view schematically showing the substrate shutter 19 opposed to the cover ring 21. A ring-shaped rib (protrusion 19a) is formed on the substrate shutter 19 to extend toward the cover ring 21. FIG. 6 is a view schematically showing the cover ring 21 opposed to the substrate shutter 19. Ring-shaped ribs are formed on the cover ring 21 to extend toward the substrate shutter 19. In this manner, the cover ring 21 has a ring shape, and includes concentric ribs (protrusions 21a and 21b) formed on its surface opposed to the substrate shutter 19.

The protrusion 19a engages with the protrusions 21a and 21b in a noncontact state when the substrate holder 7 has ascended to its upper position by the substrate holder driving mechanism 31. Alternatively, the protrusion 19a engages with the protrusions 21a and 21b in a noncontact state when the substrate shutter 19 has lowered to its lower position by the substrate shutter driving mechanism 32. In this case, the protrusion 19a is fitted in the recess formed by the plurality of protrusions 21a and 21b in a noncontact state.

Figure 7:
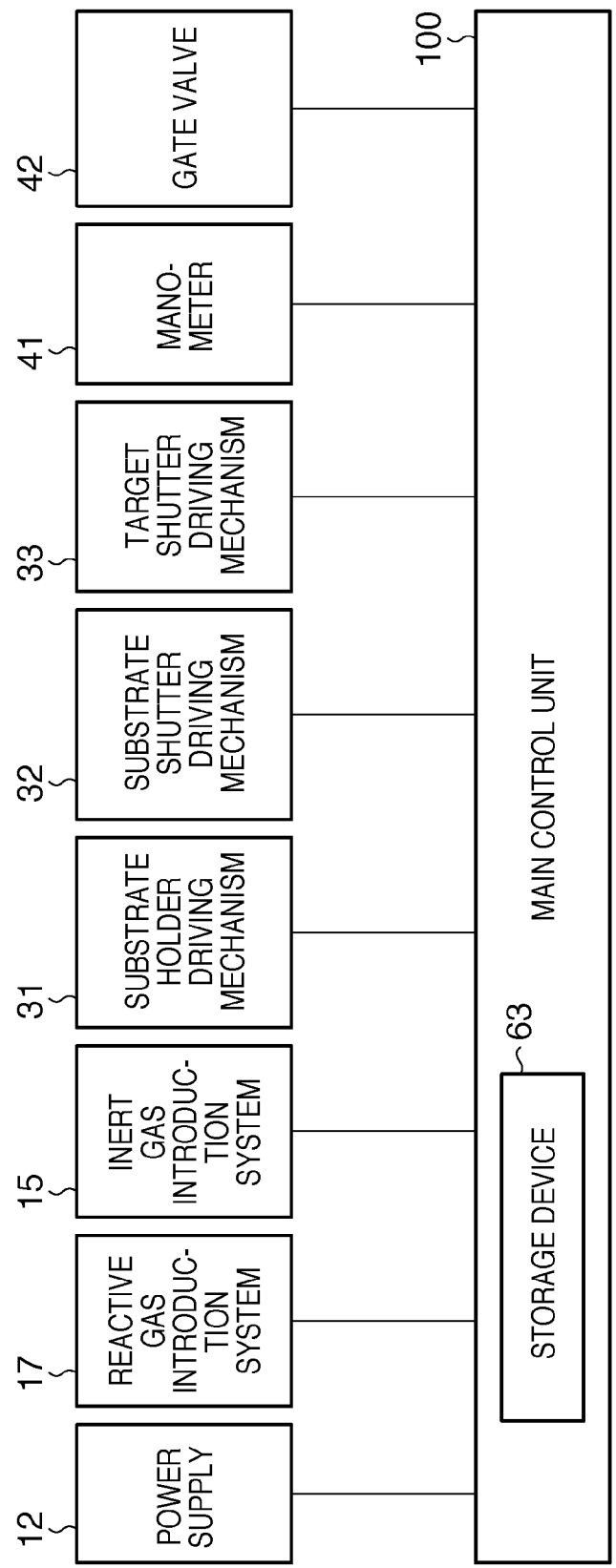
FIG. 7 is a block diagram of a main control unit for operating the sputtering apparatus.

FIG. 7 is a block diagram of a main control unit 100 for operating the sputtering apparatus 1 shown in FIG. 1. The main control unit 100 is electrically connected to the power supply 12 for supplying sputter discharge power, the inert gas introduction system 15, the reactive gas introduction system 17, the substrate holder driving mechanism 31, the substrate shutter driving mechanism 32, the target shutter driving mechanism 33, a manometer 41, and a gate valve 42, and can manage and control the operation of the sputtering apparatus 1 (to be described later).

Note that a storage device 63 built into the main control unit 100 stores a control program for executing, for example, a method of depositing a film on a substrate by conditioning and pre-sputtering according to this embodiment. The control program is implemented by, for example, a mask ROM. Alternatively, the control program can be installed via an external recording medium or a network on a storage device 63 implemented by, for example, hard disk drive (HDD).

Figure 8:
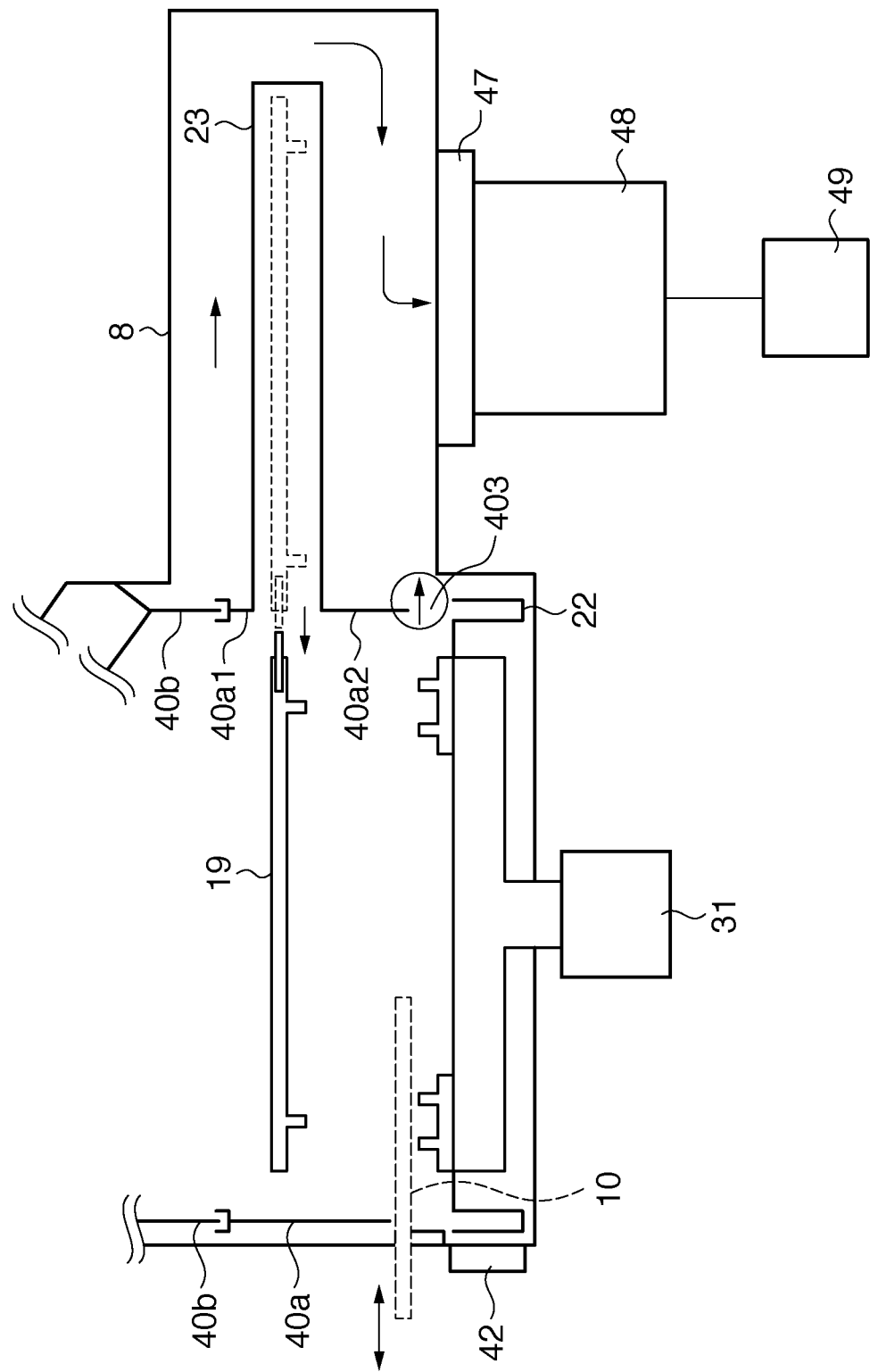
FIG. 8 is a schematic view for explaining the operation of the sputtering apparatus in loading/unloading a substrate.

FIG. 8 is a schematic view for explaining the operation of the sputtering apparatus 1 in loading/unloading a substrate. When the gate valve 42 opens, a substrate transport robot (not shown) loads/unloads a substrate 10. The shield 22 having a U-shaped distal end is connected to the substrate holder 7. When the substrate holder 7 descends by the substrate holder driving mechanism 31, a labyrinth seal formed by the shields 22 and 40a2 breaks, so the conductance of the exhaust path 403 increases to the degree that the gas easily flows through the exhaust path 403 than through the exhaust path 401. In loading/unloading a substrate, the exhaust path 403 can be used to effectively perform exhaust processing even in a short period of time required to load/unload the substrate.

Note that the sputtering apparatus 1 according to the embodiment of the present invention is used in a method of manufacturing an electronic device such as a semiconductor memory, DRAM, SRAM, nonvolatile memory, MRAM, arithmetic element, CPU, DSP, image input element, CMOS sensor, CCD, video output element, or liquid crystal display device.

FIG. 9 is a view showing the schematic configuration of a flash memory stacked film deposition apparatus (to be also simply referred to as a "stacked film deposition apparatus" hereinafter) as an example of a vacuum thin deposition apparatus including the sputtering apparatus 1 according to the embodiment. The stacked film deposition apparatus shown in FIG. 9 includes a vacuum transport chamber 910 which accommodates a vacuum transport robot 912. The vacuum transport chamber 910 is connected to a load lock chamber 911, substrate heating chamber 913, first PVD (sputtering) chamber 914, second PVD (sputtering) chamber 915, and substrate cooling chamber 917 via gate valves 920.

The operation of the stacked film deposition apparatus shown in FIG. 9 will be described below. First, a substrate to be processed (silicon wafer) is set in the load lock chamber 911 for loading/unloading the substrate to be processed into the vacuum transport chamber 910, and the load lock chamber 911 is evacuated to a vacuum until its pressure reaches $1\times10^{-4}$ Pa or less. Then, the vacuum transport robot 912 is used to load the substrate to be processed into the vacuum transport chamber 910 maintained at a degree of vacuum of $1\times10^{-6}$ Pa or less, and transport it into a desired vacuum processing chamber.

In this embodiment, first, a substrate to be processed is transported into the substrate heating chamber 913 to heat it to 400° C., and is then transported into the first PVD (sputtering) chamber 914 to deposit an $Al_2O_3$ thin film on it at a thickness of 15 nm. Next, the substrate to be processed is transported into the second PVD (sputtering) chamber 915 to deposit a TiN film on the $Al_2O_3$ thin film at a thickness of 20 nm. Lastly, the substrate to be processed is transported into the substrate cooling chamber 917 to cool it to room temperature. After all the processing operations end, the substrate to be processed is returned into the load lock chamber 911, and dry nitrogen gas is introduced into the load lock chamber 911 until its pressure reaches the atmospheric pressure to unload the substrate to be processed from the load lock chamber 911.

In the stacked film deposition apparatus according to this embodiment, the vacuum processing chamber has a degree of vacuum of $1\times10^{-6}$ Pa or less. In this embodiment, the magnetron sputtering method is used to deposit an $Al_2O_3$ film and a TiN film.

Figure 10:
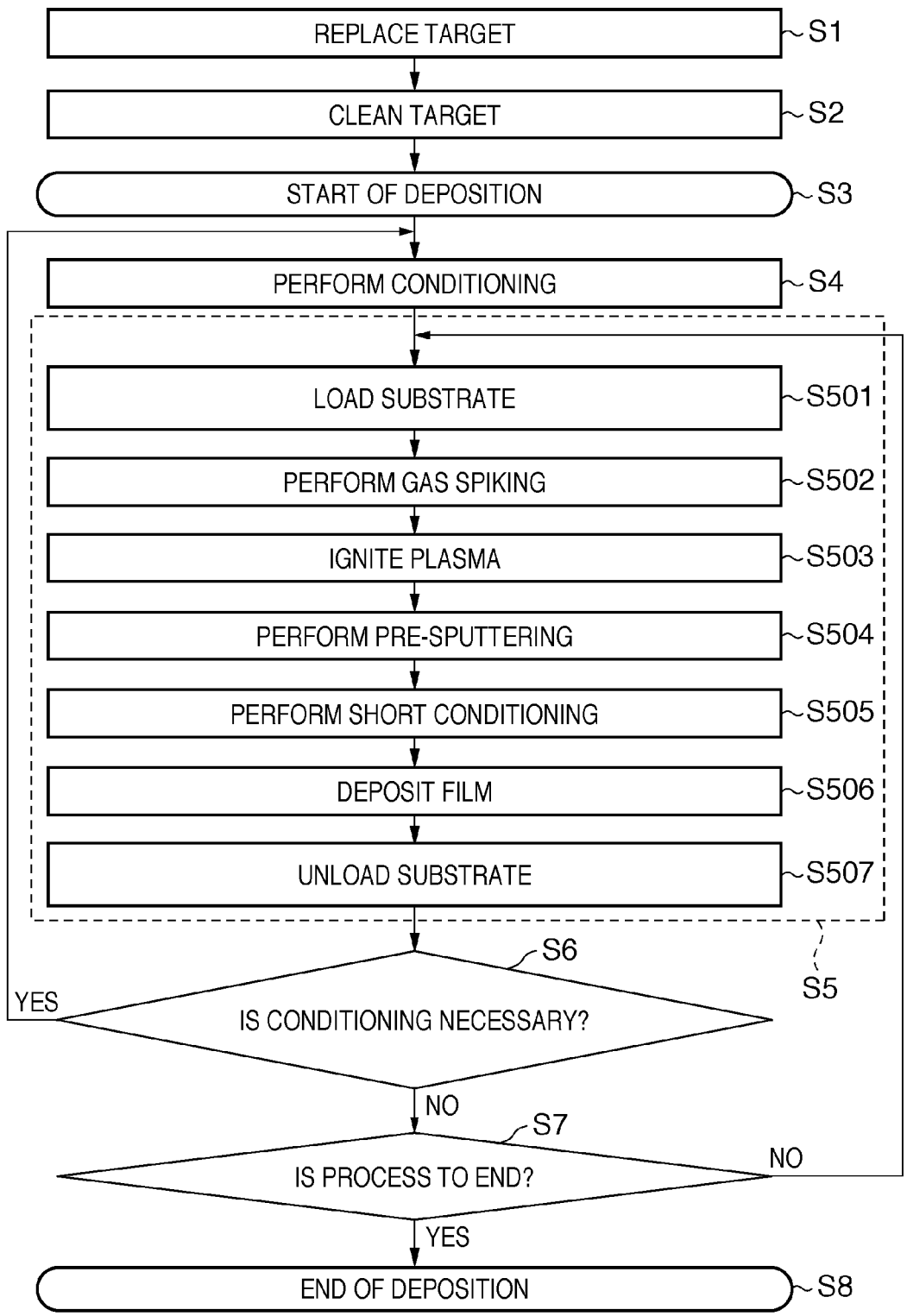
FIG. 10 is a flowchart illustrating the sequence of processing an electronic device product using the sputtering apparatus according to the embodiment of the present invention.

FIG. 10 is a flowchart illustrating the sequence of processing an electronic device product, which is associated with a method of manufacturing an electronic device, using the sputtering apparatus 1 according to the embodiment of the present invention. Note that the case wherein Ti is used as the target 4 placed in the sputtering apparatus 1, argon is used as an inert gas, and nitrogen is used as a reactive gas will be taken as an example.

In step S1, the target and shields are replaced, and the vacuum chamber 2 is evacuated to control its pressure to a predetermined pressure. When the pressure in the vacuum chamber 2 reaches the predetermined pressure, in step S2 target cleaning starts while the target shutter 14 and the substrate shutter 19 are kept closed. The target cleaning means sputtering for removing impurities and oxides adhering on the surface of the target. Target cleaning is done upon setting the level of the substrate holder, at which the substrate shutter 19 and cover ring 21 form a labyrinth seal. With this setting, sputtered particles can be prevented from adhering to the substrate mounting surface of the substrate holder. Note that target cleaning may be performed while the substrate is placed on the substrate holder.

In step S3, the main control unit 100 starts a deposition operation in accordance with a deposition start instruction input to the main control unit 100 via an input device (not shown).

Upon the issuance of a deposition start instruction in step S3, conditioning is performed in step S4. The conditioning means processing of performing discharge to stabilize the deposition characteristics so that the target is sputtered to make sputtered particles adhere to, for example, the inner wall of the chamber.

The conditioning will be described in more detail herein. FIG. 11 is a table showing the procedures for conditioning using the sputtering apparatus 1. More specifically, FIG. 11 shows the step number, the time taken for each type of processing (set time), the position of the target shutter (its open/closed state), the position of the substrate shutter (its open/closed state), the power supplied to the target, the Ar gas flow rate, and the nitrogen gas flow rate. The procedures shown in FIG. 11 are stored in the storage device 63 and continuously executed by the main control unit 100.

The procedure for deposition will be described with reference to FIG. 11. First, gas spiking is performed (step S1101). With this process, the pressure in the chamber is increased to set a state in which the target can easily start its discharge in the next plasma ignition process. As the condition to set this state, the target shutter 14 and the substrate shutter 19 are closed, no nitrogen gas is introduced, and the argon gas flow rate is 400 sccm. The argon gas flow rate is preferably 100 sccm or more so as to easily ignite a plasma in the next plasma ignition process.

A plasma ignition process is performed (step S1102). A DC power of 1,000 W is supplied to the Ti target while the shutter position and the gas conditions remain the same to generate a plasma (plasma ignition). The use of the current gas conditions makes it possible to prevent a plasma generation failure that is more likely to occur at low pressures.

Pre-sputtering is performed (step S1103). In pre-sputtering, the gas condition is changed to an argon gas flow rate of 100 sccm while the power supplied to the target remains the same. This procedure makes it possible to maintain the discharge without losing the plasma.

Conditioning 1 is performed (step S1104). In conditioning 1, the target shutter 14 opens while the power supplied to the target and the gas flow rate conditions remain the same, and the substrate shutter 19 is kept closed at the same position. With this operation, particles sputtered from the Ti target adhere to the chamber inner wall including the shield inner wall, thereby covering the shield inner wall with a low-stress film. This makes it possible to prevent a sputtered film from peeling off the shield, and, in turn, to prevent a peeled film from scattering in the chamber and falling onto a device so as to degrade the product property.

Gas spiking is performed again (step S1105). In the gas spiking process, the supply of power to the target is stopped, the argon gas flow rate is changed to 200 sccm, and the nitrogen gas flow rate is changed to 10 sccm. To facilitate ignition in the next plasma ignition process, the argon gas flow rate is preferably higher than that in the conditioning 2 process (step S1108; to be described later) and is, for example, 100 sccm or more. This also prevents a rapid change in gas flow rate upon introduction of nitrogen gas in the gas spiking process, because a nitride film is deposited using the reactive sputter method by introducing nitrogen gas in the conditioning 2 process (step S1108; to be described later).

A plasma ignition process is performed (step S1106). A DC power of 750 W is supplied to the Ti target while the shutter position and the gas conditions remain the same to generate a plasma (plasma ignition). The use of the current gas conditions makes it possible to prevent a plasma generation failure that is more likely to occur at low pressures.

Pre-sputtering is performed (step S1107). In pre-sputtering, the gas conditions are changed to an argon gas flow rate of 10 sccm and a nitrogen gas flow rate of 10 sccm while the power supplied to the target remains the same. This procedure makes it possible to maintain the discharge without losing the plasma.

Conditioning 2 is performed (step S1108). In conditioning 2, the target shutter 14 opens while the power supplied to the target and the gas flow rate conditions remain the same, and the substrate shutter 19 is kept closed at the same position. With this operation, particles sputtered from the Ti target react with nitrogen serving as a reactive gas, so a nitride film adheres to the chamber inner wall including the shield inner wall, thereby suppressing a rapid change in state of the gas in the chamber upon a shift to the next substrate deposition process. Upon the suppression of a rapid change in state of the gas in the chamber, a film can be stably deposited from the beginning in the next substrate deposition process, thus significantly improving the stability in manufacturing a device.

The time taken for each of the above-mentioned procedures is set to an optimum value. In this embodiment, the first gas spiking process (step S1101) is done for 0.1 sec, the plasma ignition process (step S1102) is done for 2 sec, the pre-sputtering process (step S1103) is done for 5 sec, the conditioning 1 process (step S1104) is done for 240 sec, the second gas spiking process (step S1105) is done for 5 sec, the second plasma ignition process (step S1106) is done for 2 sec, the second pre-sputtering process is done for 5 sec, and the conditioning 2 process (step S1108) is done for 180 sec.

Note that the second gas spiking process (step S1105) and a subsequent plasma ignition process (step S1106) and pre-sputtering process (step S1107) can also be omitted. This is desired in terms of shortening the conditioning time. However, when the conditioning 1 process (step S1104) as argon gas discharge is followed by the conditioning 2 process (step S1108) upon addition of nitrogen gas, the plasma characteristics considerably change while the discharge continues, so the number of particles may increase due to factors associated with the plasma transient state. In such a case, inserting, between the conditioning 1 process (step S1104) and the conditioning 2 process (step S1108), the processes (steps S1105, S1106, & S1107) which include temporarily stopping the discharge to exchange the gas makes it possible to further suppress a rapid change in plasma characteristics during conditioning, thus reducing the risk of generating particles.

The conditions of conditioning 2 (step S1180) as reactive sputtering are desirably set almost the same as those of deposition on the substrate (to be described later). Setting the conditions of conditioning 2 (step S1108) almost the same as those of deposition on the substrate in a product manufacturing process makes it possible to stably deposit a film on the substrate with a high reproducibility in the product manufacturing process.

Referring back to FIG. 10, step S5 including deposition processing on the substrate is performed after conditioning (step S4). The procedure for deposition processing which constitutes step S5 will be described herein with reference to FIG. 10.

First, a substrate is loaded (step S501). In the substrate loading process (step S501), the gate valve 42 opens so that a substrate transport robot and a lift mechanism (neither is shown) load a substrate 10 into the vacuum chamber 2 and place it on the substrate mounting surface of the substrate holder 7. The substrate holder 7 ascends to a deposition position while the substrate is placed on it.

Gas spiking is performed (step S502). In the gas spiking process (step S502), the target shutter 14 and the substrate shutter 19 are kept closed, argon gas is introduced at a flow rate of, for example, 200 sccm, and nitrogen gas is introduced at a flow rate of, for example, 10 sccm. Note that from the viewpoint of easily starting discharge, it is desired to introduce argon gas in an amount larger than the amount of argon gas to be introduced in a deposition process (step S506; to be described later). The time taken for the gas spiking process (step S502) is, for example, about 0.1 sec as the pressure required in the next ignition process (step S503) need only be ensured.

Plasma ignition is performed (step S503). In the plasma ignition process (step S503), while the target shutter 14 and the substrate shutter 19 are kept closed, and the argon and nitrogen gas flow rates remain the same as in the gas spiking process (step S502), a DC power of, for example, 750 W is supplied to the target 4 to generate discharge plasma near the sputter surface of the target 4. The time taken for the plasma ignition process (step S503) need only be sufficient to ignite a plasma and is, for example, 2 sec.

Pre-sputtering is performed (step S504). In the pre-sputtering process (step S504), the target shutter 14 and the substrate shutter 19 are kept closed, the argon gas flow rate is lowered to, for example, 10 sccm, and the nitrogen gas flow rate is kept at 10 sccm. At this time, a DC power of, for example, 750 W is supplied to the target 4 to maintain the discharge. The time taken for the pre-sputtering process (step S504) need only be sufficient to make preparations for the next short conditioning process and is, for example, 5 sec.

Short conditioning is performed (step S505). In the short conditioning process (step S505), the target shutter 14 opens. The substrate shutter 19 is kept closed, and both the argon and nitrogen gas flow rates are kept at 10 sccm. At this time, a DC power of, for example, 750 W is supplied to the target 4 to maintain the discharge. In this short conditioning process, a titanium nitride film is deposited on, for example, the shield inner wall, thus producing an advantageous effect in terms of deposition in a stable atmosphere in the next process of deposition on the substrate (step S506). To enhance this effect, it is desired to deposit a film under almost the same conditions as the discharge conditions in the next process of deposition on the substrate (step S506). Note that since the atmosphere has already been conditioned in the previous conditioning process (step S4), the time taken for the short conditioning process (step S505) can be shorter than the previous conditioning 1 process (step S1104) and conditioning 2 process (step S1108) and can be, for example, about 5 to 30 sec.

While the conditions of the argon and nitrogen gases and DC power remain the same as those in the short conditioning process (step S505) to maintain the discharge, and the target shutter 14 is kept open, the substrate shutter 19 opens to start deposition on the substrate (step S506). That is, the conditions of deposition on the substrate 10 include an argon gas flow rate of 10 sccm, a nitrogen gas flow rate of 10 sccm, and a DC power of 750 W supplied to the target 4. At this time, because the exhaust conductance is higher in the exhaust path 401 than in the exhaust path 403, the gas is exhausted mainly from the exhaust path 401. The exhaust conductance of a process space (a space which is surrounded by the shields and target and filled with a plasma) in the vacuum chamber 2 is less subject to the opening/closing of the substrate shutter 19 when the gas is exhausted mainly through the exhaust path 401. This is because the gas is exhausted from the exhaust path 401 into the exhaust chamber 8 while the shutter accommodation unit 23 suppresses a change in exhaust conductance across the distance from the process space to the exhaust device as the state of the substrate shutter 19 changes from a closed state to an open state. Therefore, at the start of deposition on the substrate as the substrate shutter 19 opens while the discharge is maintained, it is possible to suppress a fluctuation in plasma characteristics due to a fluctuation in pressure within the process space. As a fluctuation in plasma characteristics due to a fluctuation in pressure within the process space is suppressed, deposition on the substrate can be stably started. Especially when the boundary characteristics are of prime importance as in the case wherein a gate electrode is deposited on a gate insulating film in the manufacture of a gate stack, the above-mentioned arrangement greatly improves both the property of a device to be manufactured and the stability in manufacturing the device.

After the power supplied to the target 4 is stopped to end the deposition process on the substrate in step S506, the substrate is unloaded in step S507. In the substrate unloading process in step S507, the substrate holder 7 descends, and the gate valve 42 opens so that the substrate transport robot and lift mechanism (neither is shown) unload the substrate 10.

The main control unit 100 determines the need for conditioning (step S6). In the conditioning need determination process (step S6), the main control unit 100 determines whether conditioning is necessary, based on the determination conditions stored in the storage device 63. If the main control unit 100 determines in step S6 that conditioning is necessary, the process returns to step S4, in which conditioning is performed again (step S4). On the other hand, if the main control unit 100 determines in step S6 that conditioning is unnecessary, the process advances to the next end determination process in step S7. It is determined in step S7 whether the process is to end, based on whether an end signal has been input to the main control unit 100 or whether a substrate to be processed remains to be supplied to the apparatus. If NO is determined in step S7, the process returns to step S501, in which a series of processes from the substrate loading process (step S501) to the substrate unloading process (in step S507), including the deposition process (step S506), is performed again. In this way, the above-mentioned series of processes is continued until deposition processes are performed on a predetermined number of product substrates, for example, about several hundred films are deposited on these product substrates.

An example of how to determine that conditioning is to start in the conditioning need determination process (step S6) will be described. After the continuous processes, a standby time may occur because of, for example, the product wait time. If a standby time corresponding to a threshold at which conditioning is determined to be necessary based on the determination conditions stored in the storage device 63 occurs, the main control unit 100 determines that conditioning is necessary, and performs a conditioning process in step S4 again. With this conditioning process, the surface on a high-stress film such as TiN adhering on the shield inner surface can be covered with a low-stress film such as Ti. As TiN continuously adheres to the shield, a TiN film peels and generates particles because its stress is high and its adhesion strength to the shield is weak. For this reason, Ti is sputtered in order to prevent a TiN film from peeling.

A Ti film has a good adhesion strength to a TiN film, and therefore produces an effect (overcoating effect) of preventing the TiN film from peeling. In this case, it is effective to use the substrate shutter 19 in order to sputter Ti on the entire shield. In the sputtering apparatus 1 according to the embodiment of the present invention, the substrate shutter 19 and the cover ring 21 form a labyrinth seal, so a conditioning process can be performed without depositing a sputtered film on the substrate mounting surface of the substrate holder. After this conditioning process, a deposition process in step S5 (steps S501-S507) is performed again.

As described above, conditioning is performed, and then the procedures for processing a product are repeated until the life of the target comes to an end. Upon this operation, maintenance is done, in which the shields and target are replaced, and the initial target cleaning process and subsequent processes are repeated.

With the above-mentioned procedures, an electronic device can be manufactured while preventing a film adhering on the shield from peeling and a sputtered film from adhering to the substrate mounting surface of the substrate holder. Although an example in which maintenance is done as the life of the target comes to an end has been given in this embodiment, maintenance is done to replace the shields in the same way. Also, although an example in which conditioning starts when a standby time occurs has been given herein, the conditioning start conditions (conditioning need determination conditions) are not limited to the above-mentioned example.

FIG. 12 is a table for explaining exemplary conditioning start conditions (conditioning need determination conditions). The determination conditions to start conditioning include the total number of processed substrates, the total number of processed lots, the total thickness of a deposited film, the amount of power supplied to the target, the amount of power supplied to the target to deposit a film using a replaced shield, the standby time, and a change in deposition condition with, for example, a change in electronic device to be processed.

A time after the end of processing each lot (the lot is a group of substrates set for the sake of convenience in terms of managing the manufacturing process, and 25 substrates are normally grouped into one lot) can be set as the conditioning start timing. If a plurality of lots to be processed (processing lots) are present, the total number of processing lots is set as a determination condition, so a time after the end of processing a total number of lots can be set as the conditioning start timing (conditioning start conditions 1, 3, 5, 7, 9, and 11). Alternatively, if one of the above-mentioned determination conditions, other than the condition associated with lots, is satisfied in the course of lot processing, an interruption of the processing can be determined as the conditioning start timing (conditioning start conditions 2, 4, 6, 8, 10, and 12).

A method of determining the need for conditioning based on the total number of processed substrates (1201) is advantageous in that the conditioning interval can be maintained constant even if the number of substrates which constitute each lot varies. A method of determining the need for conditioning based on the total number of processing lots (1202) is advantageous in that the conditioning period can be predicted when process management is performed based on the number of lots.

A method of determining the need for conditioning based on the total thickness of a film deposited by the deposition apparatus (1203) is advantageous in that conditioning can be performed at an appropriate timing when the probability that a film will peel off the shield increases in proportion to its thickness. A method of determining the need for conditioning based on the integrated power of the target (1204) is advantageous in that conditioning can be performed at an appropriate timing when the target surface changes upon a deposition process. A method of determining the need for conditioning based on the integrated power per shield (1205) is advantageous in that conditioning can be performed at an appropriate timing even if the periods of shield replacement and target replacement are different. A method of determining the need for conditioning based on the standby time (1206) stabilizes the deposition characteristics in a good state when the deposition characteristics may degrade due to a change in residual gas concentration or temperature in the deposition chamber during the standby time. A method of determining the need for conditioning using a change in deposition condition on the substrate (product manufacturing condition) as a determination condition (1207) can stably deposit a film on the substrate even if the deposition condition is changed. Upon a change in deposition condition, the state of the shield inner wall surface or target surface changes. Such changes lead to, for example, a fluctuation in gas composition or electrical property due to factors associated with, for example, the gettering performances of the shield inner wall surface and target surface, resulting in a variation in deposition characteristics on the substrates within the lot. The method of determining the need for conditioning using a change in deposition condition on the substrate (product manufacturing condition) as a determination condition (1207) suppresses such a failure.

A method of performing conditioning after lot processing prevents any interruption of the lot processing when the manufacturing processes are managed for each lot (conditioning start conditions 1, 3, 5, 7, 9, and 11). A method of interrupting lot processing for conditioning is advantageous in that conditioning can be performed at an exact timing (conditioning start conditions 2, 4, 6, 8, 10, and 12). When a change in deposition condition is set as a determination condition, conditioning is performed before lot processing (conditioning start condition 13).

FIG. 13 is a graph showing the result of measuring once a day the number of particles which adhere onto a substrate when the processing shown in FIG. 10 is executed using the sputtering apparatus 1 according to the embodiment of the present invention. The abscissa indicates the measurement day, and the ordinate indicates the number of particles which have a size of 0.09 μm or more and are observed on a silicon substrate having a diameter of 300 mm. The number of particles was measured using a surface inspection apparatus called "SP2 (trade name)" available from KLA-Tencor, Inc. This data shows that the number of particles can satisfactorily be kept as very small as 10 or less per substrate for a period of time as relatively long as 16 days.

(Modification)

Figure 14:
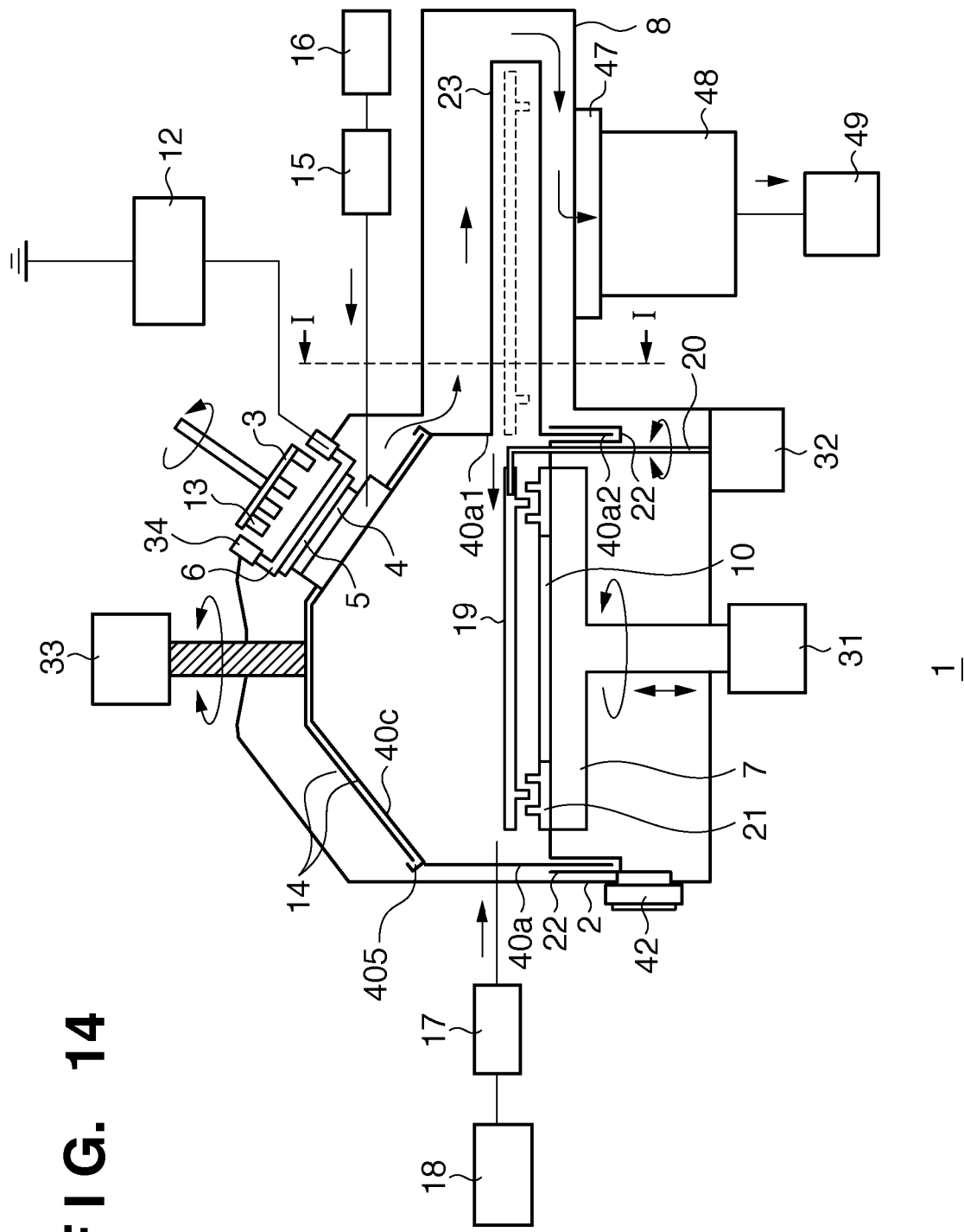
FIG. 14 is a schematic view of a modification of the sputtering apparatus according to the embodiment of the present invention.

FIG. 14 is a schematic view of a modification of the sputtering apparatus according to the embodiment of the present invention. Since a sputtering apparatus 1 according to this modification has basically the same configuration as the sputtering apparatus 1 shown in FIG. 1, the same reference numerals denote the same constituent members, and a detailed description thereof will not be given. In the sputtering apparatus 1 according to this modification, an exhaust path (first exhaust path) 405 is formed in a counter shield 40c on the ceiling, instead of forming an exhaust port in a shield 40a1. This similarly makes it possible not only to stabilize the pressure in the above-mentioned vacuum chamber, but also to prevent sputtered particles from depositing on portions near the exhaust path 405 because of its distance, thereby more reliably maintaining the exhaust conductance constant. Also, the exhaust path 405 of the counter shield 40c has a labyrinth structure.

Figure 15:
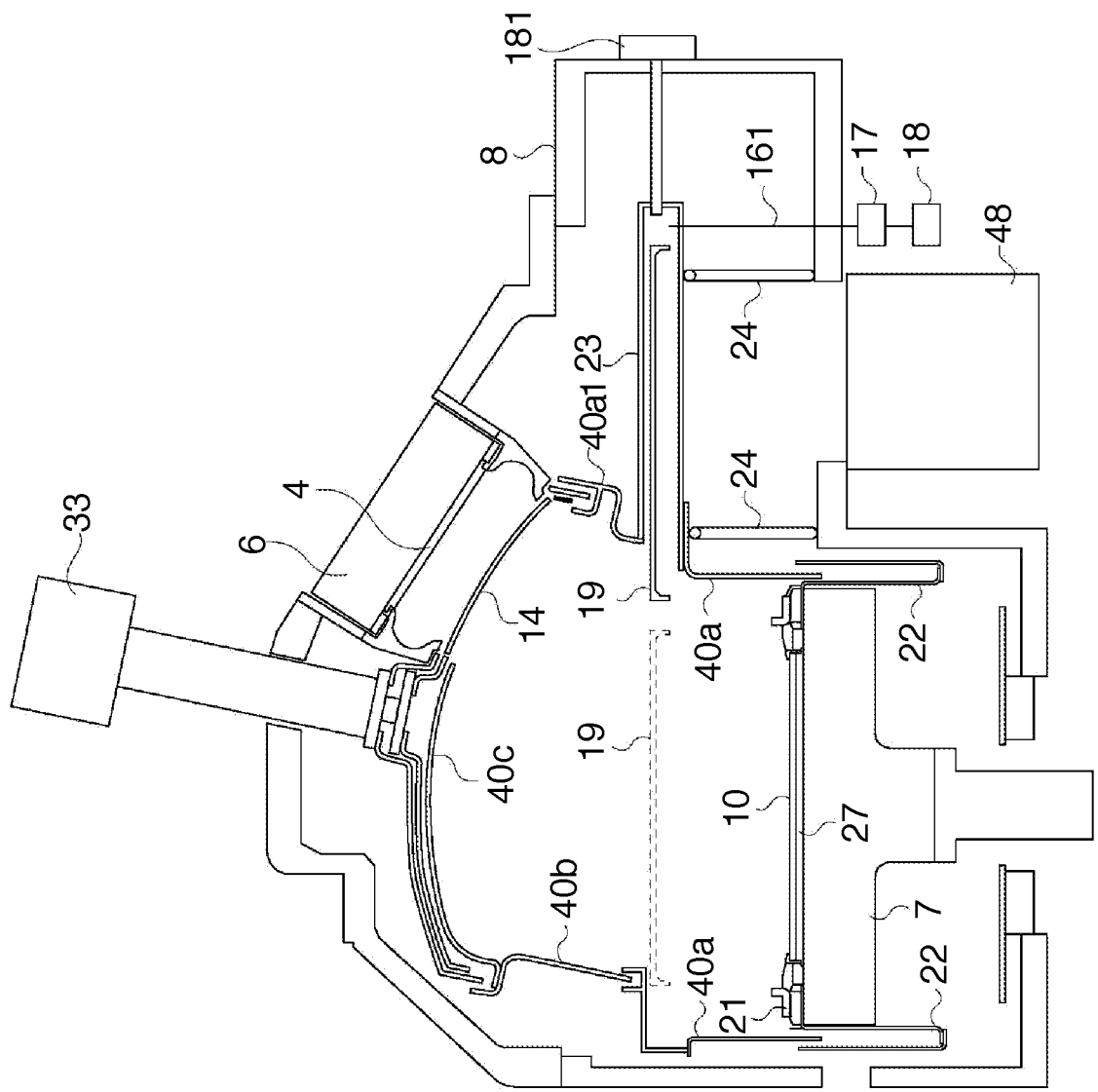
FIG. 15 is a view for explaining how a shutter accommodation unit and shields according to the present invention can be attached to the sputtering apparatus.

FIG. 15 is a view for explaining how a shutter accommodation unit and shields can be attached to the sputtering apparatus. Since the sputtering apparatus shown in FIG. 15 has basically the same configuration as the sputtering apparatus 1 shown in FIG. 1, the same reference numerals denote the same constituent members, and a detailed description thereof will not be given. A flange portion of a shield 40a is attached to the bottom surface of a shutter accommodation unit 23, and supported by the bottom surface of the chamber by columns 24. The shutter accommodation unit 23, the flange portion of the shield 40a, and the columns 24 can be detachably fixed by screwing. Also, a shield 40b can be detachably fixed to the upper surface of the shutter accommodation unit 23 by screwing. Hence, the shutter accommodation unit 23 and shields 40a and 40b are detachable and therefore can be periodically replaced with a new shutter accommodation unit and shields or cleaned. This makes it possible to prevent particles from being generated in the chamber too much. Upon the prevention of particles from being generated in the chamber, a film is deposited on the surface of a substrate 10 placed on a substrate mounting portion 27 of a substrate holder 7, thereby improving the product yield in manufacturing an electronic device. Also, the use of the detachable shutter accommodation unit 23 and shields increases the operating ratio of the sputtering apparatus, thereby improving the product manufacturing efficiency.

Figure 16:
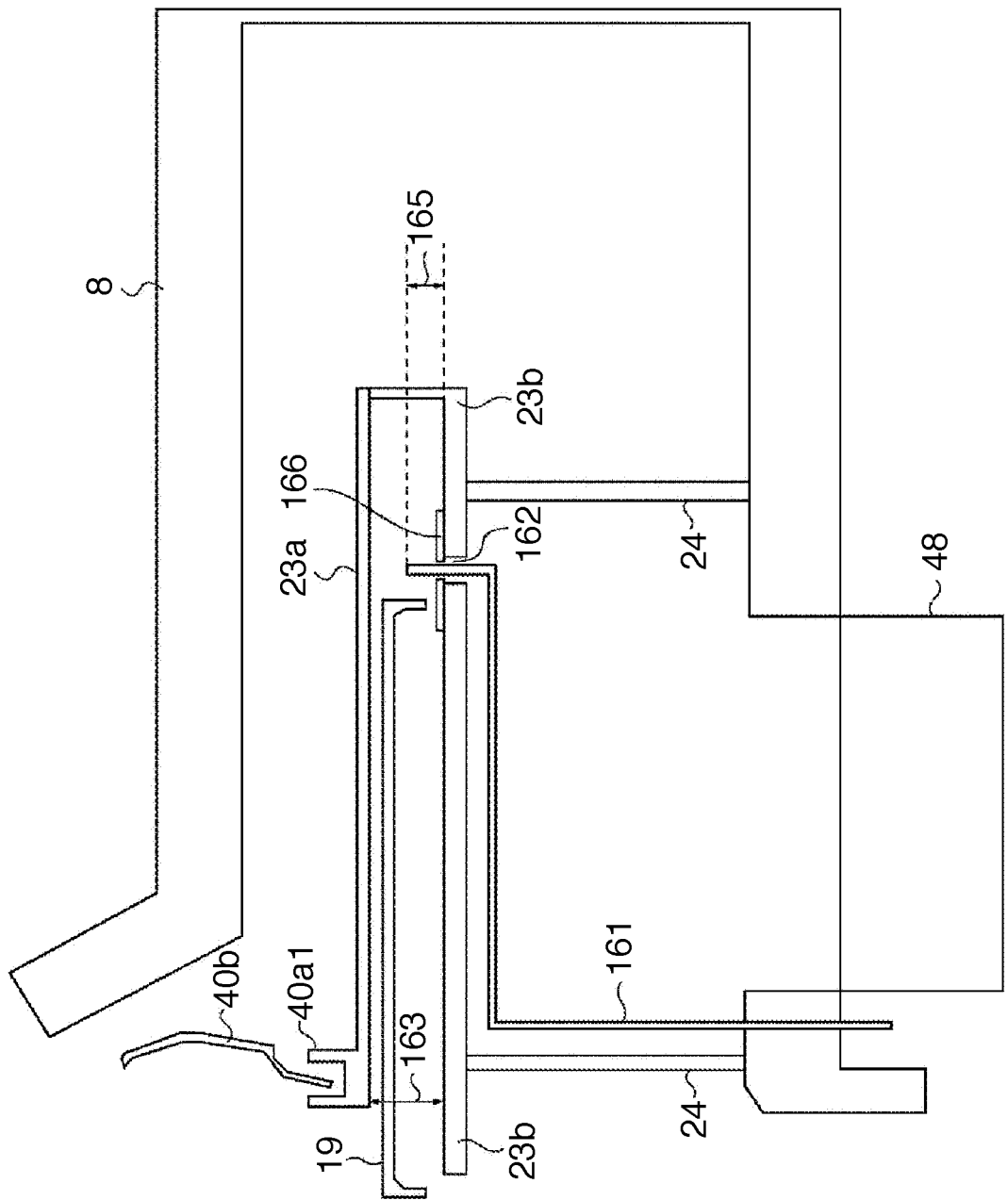
FIG. 16 is a view for explaining another embodiment of a shutter accommodation unit 23 according to the present invention.

Further, a reactive gas introduction system 17 for introducing a reactive gas (for example, oxygen or nitrogen) into the shutter accommodation unit 23 may be provided. FIG. 16 is an enlarged view for explaining a configuration which introduces a reactive gas into the shutter accommodation unit 23 according to the present invention. The shutter accommodation unit 23 is formed by a lid plate 23a and frame body 23b for the sake of easy replacement and cleaning, as shown in FIG. 16. A gas introduction pipe 161 is placed so as to introduce a gas from the exterior to the interior of the exhaust chamber 8, and reaches the interior of the shutter accommodation unit 23 through a gas introduction opening portion 162 formed in the frame body 23b of the shutter accommodation unit 23. Note that the gas introduction opening portion 162 has a circular shape with a diameter larger than that of the gas introduction pipe 161. In this embodiment, the gas introduction pipe 161 has a diameter of 6.35 mm, the gas introduction opening portion 162 has a diameter of 7 mm, and the gas introduction pipe protruding into the shutter accommodation unit 23 has a length 165 of 15 mm. The opening portion 162 of the shutter accommodation unit 23 has a height 163 of 33 mm and a width of 450 mm (not shown). The gap formed between the gas introduction pipe 161 and the opening portion 162 due to the difference in diameter is about 0.5 mm, which is sufficiently smaller than the height 163 of the shutter accommodation unit 23, that is, 33 mm. Since the gas flows through a flow channel having a high conductance (high gas flowability), it is desired to set the conductance from the shutter accommodation unit 23 to the process space sufficiently higher than that of the gap between the gas introduction pipe 161 and the opening portion 162, as in this case. This is done because the gas can be reliably introduced into the process space even in the presence of processing variations in shape of the opening portion 162 or variations in mounting position of the shutter accommodation unit 23. The effect of stabilizing the deposition characteristics by reliably introducing the gas is especially remarkable when a reactive gas is used. It is also desired to set the position of the gas introduction opening portion 162 of the shutter accommodation unit 23 on the opposite side of its position as the substrate shutter 19 is in a retracted state, as shown in FIG. 16. Since sputtered particles can hardly reach this position, it is possible to prevent sputtered particles from clogging the gas blowing port of the reactive gas introduction system including the gas introduction pipe 161, or sputtered particles adhering on the gas introduction pipe from contaminating the substrate upon peeling and scattering in the chamber. A reactive gas supply device (gas cylinder) 18 for supplying a reactive gas is connected to the reactive gas introduction system 17. Further, a conductance adjusting member 166 including an opening portion into which the gas introduction pipe 161 is to be inserted may be detachably attached to the shutter accommodation unit 23 so as to cover the gas introduction opening portion 162, as shown in FIG. 16. In this case, the diameter of the gas introduction opening portion 162 is desirably sufficiently larger than that of the gas introduction pipe 161, for example, 12 mm or more, and the diameter of the opening portion into which the gas introduction pipe of the conductance adjusting member 166 is to be inserted is desirably slightly larger than the outer diameter of the gas introduction pipe 161, for example, 7 mm or more. As a method of mounting the shutter accommodation unit 23, first, the shutter accommodation unit 23 is screwed into the columns 24 while the gas introduction pipe 161 is inserted in the gas introduction opening portion 162 formed in the shutter accommodation unit 23, and the conductance adjusting member 166 is placed so as to cover the gas introduction pipe 161. Then, the lid plate 23a of the shutter accommodation unit 23 is fixed to the upper portion of the frame body 23b of the shutter accommodation unit 23 by, for example, screwing. This procedure makes it possible to prevent dust generation as the gas introduction pipe 161 comes into contact with the frame body 23b of the shutter accommodation unit 23 or damage to the shutter accommodation unit 23 or gas introduction pipe 161, when the shutter accommodation unit 23 is mounted. Alternatively, gas introduction pipe passages may be formed in the columns 24 to introduce a gas into the vacuum chamber 23. In this case, a gas introduction pipe 161 need not always be placed. With this configuration, the number of components can be reduced, thus facilitating a maintenance operation.

Figure 17:
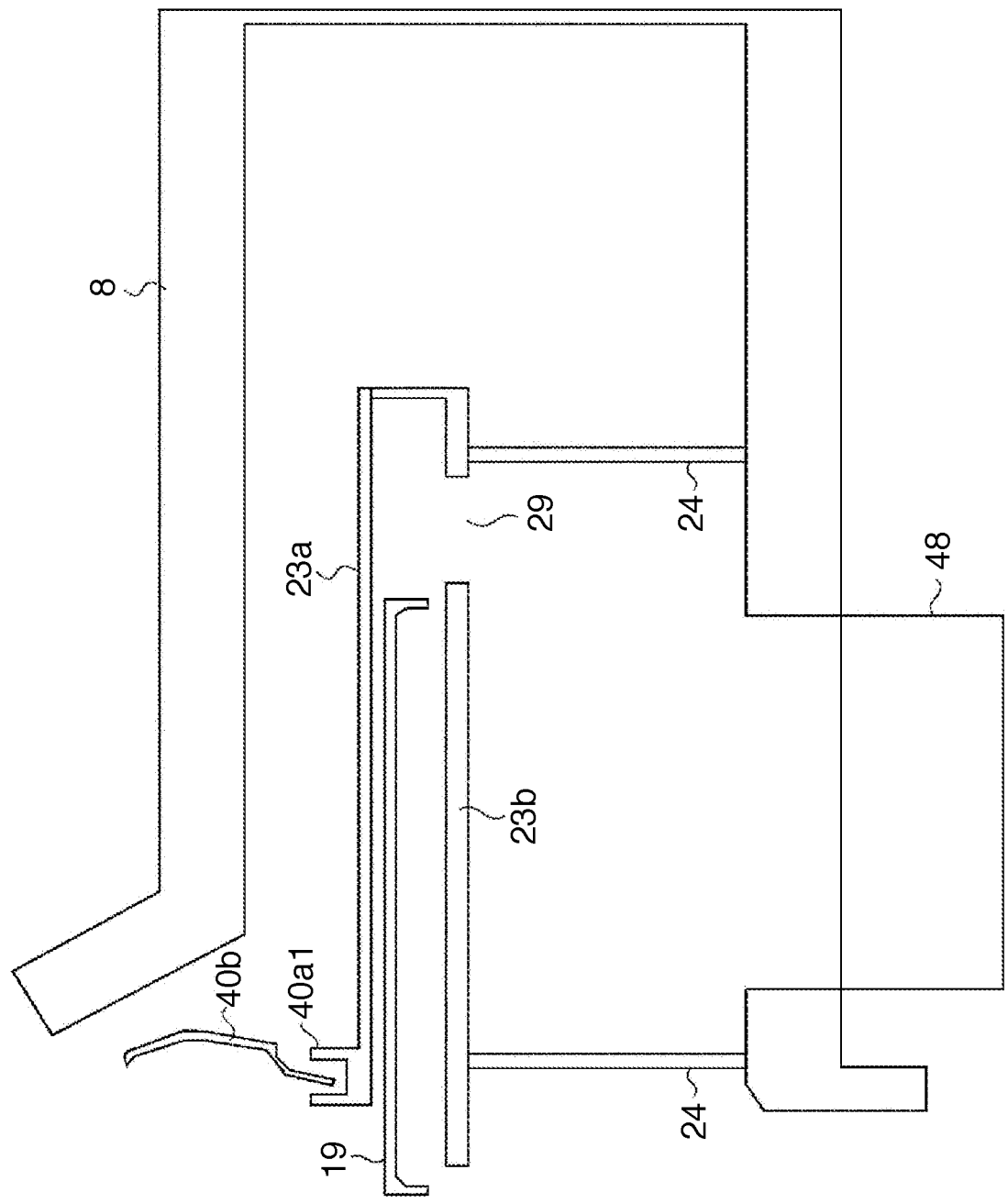
FIG. 17 is a view for explaining still another embodiment of the shutter accommodation unit 23 according to the present invention.

Also, a through hole 29 may be formed in the shutter accommodation unit 23 to communicate with the turbo-molecular pump 48 as the exhaust device. FIG. 17 is an enlarged view for explaining this embodiment. Since sputtered particles can hardly reach the interior of the shutter accommodation unit 23, it is possible to prevent sputtered particles from clogging the through hole 29. Also, such a configuration can efficiently exhaust a residual gas remaining in the shutter accommodation unit 23. Although the through hole 29 is formed in the bottom surface of the frame body 23b of the shutter accommodation unit 23 in this embodiment, it may be formed on the side of the side or upper surface of the shutter accommodation unit 23. Also, when the through hole 29 is formed in the shutter accommodation unit 23, it may have an openable/closable structure by, for example, placing a gate valve. Such a structure can attain both exhaust of a residual gas in the shutter accommodation unit 23 and stable exhaust in deposition.

Figure 18:
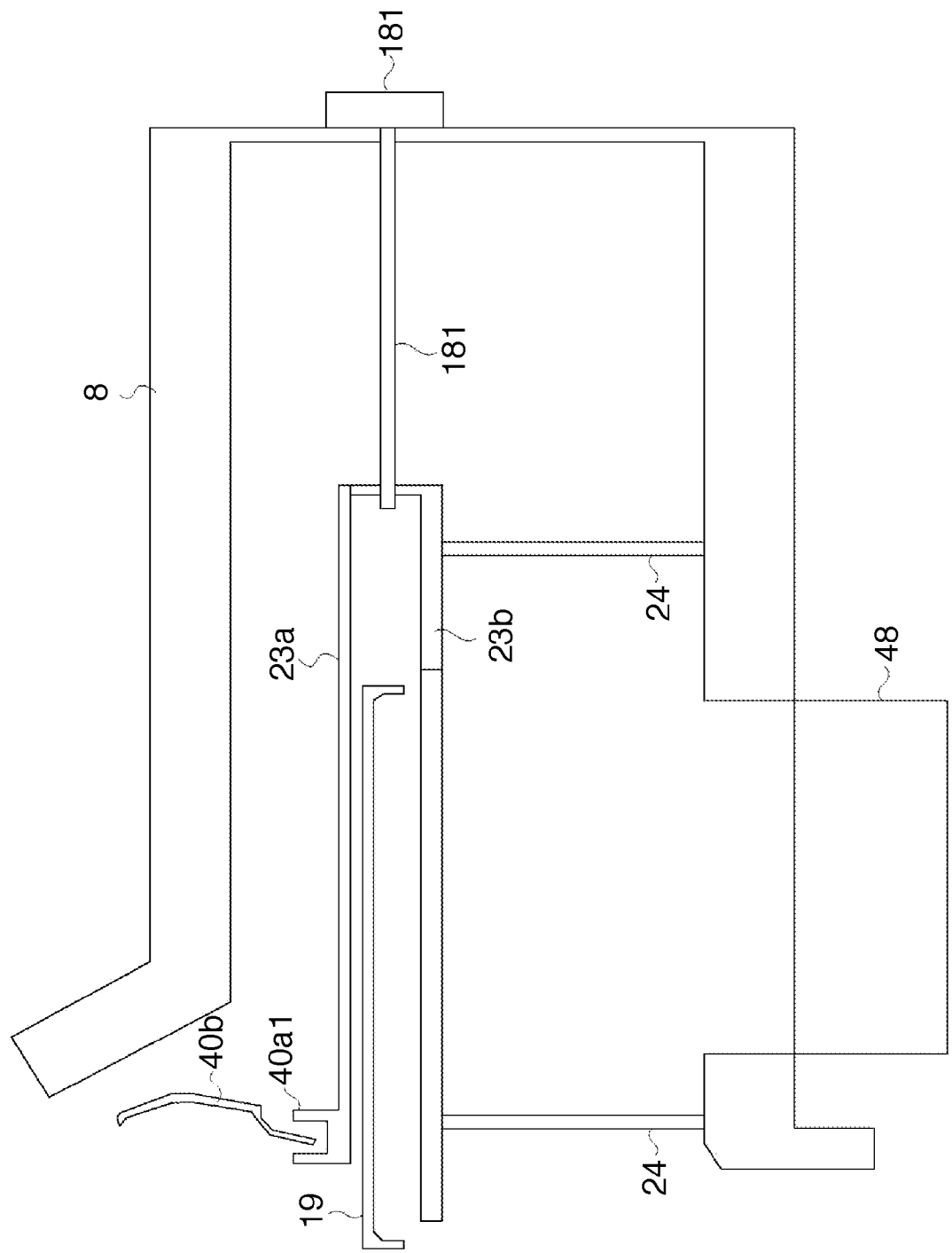
FIG. 18 is a view for explaining still another embodiment of the shutter accommodation unit 23 according to the present invention.

Moreover, a measuring means 181 (for example, a manometer, a potentiometer, or a spectrometer) for measuring the pressure in the vacuum chamber 2 may be placed in the shutter accommodation unit 23. Performing deposition or conditioning while adjusting, for example, the gas flow rate based additionally on the measurement result obtained by the measuring means 181 makes it possible to attain a deposition method with a higher reproducibility. This adjustment may be done under the control of the main control unit 100. FIG. 18 is a view for explaining this embodiment. The measuring means 181 may be connected into the shutter accommodation unit 23 and partially placed outside the chamber. The information of the measurement result obtained by the measuring means 181 is sent to the main control unit 100 from a measuring device input/output port (not shown). Since sputtered particles can hardly reach the interior of the shutter accommodation unit 23, it is possible to prevent sputtered particles from clogging the measuring means 181.

Although shield members are formed around the entire opening portion of the shutter accommodation unit 23 in the above-mentioned embodiments, the present invention is not limited to this, and a shield member may at least partly be formed around the opening of the shutter accommodation unit 23 (for example, a shield member may be placed in the upper portion of the opening portion of the shutter accommodation unit 23). Also, although shield members are detachably attached to the shutter accommodation unit 23 in the above-mentioned embodiments, they may be integrated with the shutter accommodation unit 23.

Moreover, although only one target holder (cathode) 6 is used in the above-mentioned embodiments, the present invention is not limited to this, and two or more target holders may be used.

The present invention is not limited to the above-described embodiments, and various changes and modifications can be made within the spirit and scope of the present invention. Therefore, to apprise the public of the scope of the present invention, the following claims are made.

The invention claimed is:

1. A sputtering apparatus comprising:
a processing chamber configured to perform deposition processing;
an exhaust chamber directly connected to the processing chamber;
an exhaust device which evacuates the processing chamber through the exhaust chamber;
a substrate holder which is placed in the processing chamber, and configured to place a substrate thereon;
a target holder placed in the processing chamber;
a shutter capable of moving to assume one of a shielding state in which the shutter shields a gap between the substrate holder and the target holder, and a retracted state in which the shutter is retracted from the gap between the substrate holder and the target holder;
a driving unit configured to drive the shutter;
a shutter accommodation unit having an opening portion through which the shutter is to be extended to the processing chamber and retracted from the processing chamber; and
a gas introduction pipe configured to introduce a gas in the processing chamber through the opening portion of the shutter accommodation unit,
wherein an exhaust port is formed between a periphery of the opening portion of the shutter accommodation unit and an inner wall of the exhaust chamber,
wherein the shutter accommodation unit is placed in the exhaust chamber such that an exhaust region is formed outside the shutter accommodation unit and inside the exhaust chamber and the exhaust region is in communication with the exhaust device, and the shutter accommodation unit is sealed with respect to the exhaust chamber so that the gas introduced in the shutter accommodation unit does not pass from the shutter accommodation unit to the exhaust chamber and the gas flows into the processing chamber only through the opening portion,
wherein the gas introduction pipe is arranged from an outside of the exhaust chamber to an inside of the shutter accommodation unit, and
wherein a gas introduced from the gas introduction pipe in the shutter accommodation unit is introduced in the processing chamber through the opening portion of the shutter accommodation unit, the gas introduced in the processing chamber is exhausted by the exhaust device through the exhaust port and the exhaust region.

2. The sputtering apparatus according to claim 1,
wherein a first shield member is provided with an inside surface of the processing chamber to cover the inside surface of the processing chamber, and
wherein the first shield member includes a second shield member which is formed to at least part of a periphery of the opening portion of the shutter accommodation unit to cover at least part of the exhaust port of the exhaust chamber.

3. The sputtering apparatus according to claim 1, wherein a measuring unit is provided in the shutter accommodation unit to measure a pressure in the processing chamber.

4. The sputtering apparatus according to claim 2, wherein the shutter accommodation unit and the second shield member are integrated with each other.

5. The sputtering apparatus according to claim 2, wherein the shutter accommodation unit and the second shield member are provided separately from each other, the second shield member is detachably attached to the shutter accommodation unit.

6. The sputtering apparatus according to claim 1, wherein a gas blowing port at an end of the gas introduction pipe is arranged in the shutter accommodation unit through a gas introduction opening portion,
  wherein the gas blowing port is placed between the shutter in the retracted state and the shutter accommodation unit on the opposite side of the opening portion of the shutter accommodation unit, and
  wherein the gas introduced in the shutter accommodation unit from the gas blowing port is introduced in the processing chamber through the opening portion of the shutter accommodation unit.

7. The sputtering apparatus according to claim 2, wherein the first shield member is a cylindrical shield member to cover the inner surface of the processing chamber between the substrate holder and the target holder,
  wherein the second shield member is arranged below the opening portion of the shutter accommodation unit and has a function as a shield which covers the exhaust port, and
  wherein the shutter accommodation unit is attached to the exhaust chamber by the second shield member.

8. The sputtering apparatus according to claim 2, wherein the first shield member is a cylindrical shield member to cover the inner surface of the processing chamber between the substrate holder and the target holder,
  wherein the second shield member is arranged below the opening portion of the shutter accommodation unit and has a column as a shield which covers the exhaust port, and
  wherein the shutter accommodation unit is attached to the exhaust chamber by the second shield member.

* * * * *